United States Patent
Yamashita et al.

(10) Patent No.: US 10,682,831 B2
(45) Date of Patent: Jun. 16, 2020

(54) COMPOSITE PLATE AND METHOD FOR PRODUCING SAME

(71) Applicant: TOSOH CORPORATION, Shunan-shi, Yamaguchi (JP)

(72) Inventors: Isao Yamashita, Ayase (JP); Kohei Imai, Ayase (JP); Shoichi Yamauchi, Ayase (JP); Koji Tsukuma, Ayase (JP)

(73) Assignee: TOSOH CORPORATION, Yamaguchi (JP)

( * ) Notice: Subject to any disclaimer, the term of this patent is extended or adjusted under 35 U.S.C. 154(b) by 706 days.

(21) Appl. No.: 14/443,477

(22) PCT Filed: Dec. 5, 2013

(86) PCT No.: PCT/JP2013/007159
§ 371 (c)(1),
(2) Date: May 18, 2015

(87) PCT Pub. No.: WO2014/087655
PCT Pub. Date: Jun. 12, 2014

(65) Prior Publication Data
US 2015/0283791 A1    Oct. 8, 2015

(30) Foreign Application Priority Data

Dec. 7, 2012 (JP) ................. 2012-268398

(51) Int. Cl.
*B32B 9/00* (2006.01)
*B32B 37/12* (2006.01)
(Continued)

(52) U.S. Cl.
CPC .............. *B32B 9/005* (2013.01); *B32B 3/263* (2013.01); *B32B 5/022* (2013.01); *B32B 7/12* (2013.01);
(Continued)

(58) Field of Classification Search
CPC .. H05K 5/0217; G04B 37/22; C04B 35/6455; C04B 37/008; C04B 35/486;
(Continued)

(56) References Cited

U.S. PATENT DOCUMENTS 4,742,030 A * 5/1988 Masaki ................. C04B 35/486
423/608
2006/0268528 A1* 11/2006 Zadesky ............... H04M 1/026
361/728

(Continued)

FOREIGN PATENT DOCUMENTS

JP     6-242260 A    9/1994
JP     10-029205 A   2/1998
(Continued)

OTHER PUBLICATIONS

By Karaulov (Karaulov, et al., "Sintering zirconia with ytrrium oxide," Ukrainian Scientific-Research Institute for Refractories, No. 2, p. 54-58, Feb. 1975).*

(Continued)

*Primary Examiner* — Gerard Higgins
*Assistant Examiner* — Kevin C Ortman, Jr.
(74) *Attorney, Agent, or Firm* — Sughrue Mion, PLLC

(57) ABSTRACT

A composite plate has a thickness of 2 mm or less, which is obtained by laminating and closely fixing a zirconia sintered body and a fiber-reinforced plastic with each other, and the thickness ratio of the zirconia sintered body to the fiber-reinforced plastic is 0.01 to 1, and the apparent density of the composite plate is 4.3 g/cm$^3$ or less. A composite plate has a thickness of 2 mm or less, which is obtained by laminating and closely fixing a zirconia sintered body and a fiber-reinforced plastic with each other, and the maximum roughness depth of the surface of the zirconia sintered body is 50 µm or less per 1 cm$^2$.

15 Claims, 12 Drawing Sheets

(51) Int. Cl.
- B32B 27/38 (2006.01)
- B32B 3/26 (2006.01)
- B32B 7/12 (2006.01)
- B32B 9/04 (2006.01)
- B32B 37/18 (2006.01)
- H05K 5/02 (2006.01)
- C04B 35/486 (2006.01)
- B32B 5/02 (2006.01)
- G04B 37/22 (2006.01)
- C04B 35/645 (2006.01)
- C04B 37/00 (2006.01)

(52) U.S. Cl.
CPC ............. *B32B 9/002* (2013.01); *B32B 9/045* (2013.01); *B32B 9/047* (2013.01); *B32B 27/38* (2013.01); *B32B 37/18* (2013.01); *C04B 35/486* (2013.01); *C04B 35/6455* (2013.01); *C04B 37/008* (2013.01); *G04B 37/22* (2013.01); *H05K 5/0217* (2013.01); B32B 37/12 (2013.01); B32B 2037/1246 (2013.01); B32B 2250/02 (2013.01); B32B 2255/10 (2013.01); B32B 2262/101 (2013.01); B32B 2262/106 (2013.01); B32B 2305/08 (2013.01); B32B 2307/4026 (2013.01); B32B 2307/536 (2013.01); B32B 2307/538 (2013.01); B32B 2307/554 (2013.01); B32B 2307/558 (2013.01); B32B 2307/56 (2013.01); B32B 2307/584 (2013.01); B32B 2307/72 (2013.01); B32B 2315/02 (2013.01); B32B 2398/00 (2013.01); B32B 2457/00 (2013.01); C04B 2235/3225 (2013.01); C04B 2235/77 (2013.01); C04B 2235/96 (2013.01); C04B 2235/9661 (2013.01); C04B 2237/348 (2013.01); C04B 2237/70 (2013.01); C04B 2237/704 (2013.01); *Y10T 428/1321* (2015.01); *Y10T 428/24355* (2015.01); *Y10T 428/24967* (2015.01)

(58) Field of Classification Search
CPC ......... B32B 9/005; B32B 5/022; B32B 9/045; B32B 3/263; B32B 37/18; B32B 27/38; B32B 7/12; B32B 9/002; B32B 9/047; B32B 2307/538
USPC ............ 428/516, 213, 220, 354, 216, 313.9, 428/317.3, 355 AC, 41.8, 448, 450, 457, 428/113, 138, 156, 172, 175, 212, 215, 428/221, 223, 299.4, 305.5, 311.51, 428/313.3, 317.1, 319.3, 325, 327, 334, 428/336, 337, 339, 34.5, 34.9, 355 BL, 428/41.3, 421, 441, 446, 447, 458, 469, 428/480, 483, 519, 520, 75, 76
See application file for complete search history.

(56) References Cited

U.S. PATENT DOCUMENTS

| 2011/0117369 A1* | 5/2011 | DeRudder | ............... B32B 27/08 428/412 |
| 2012/0058883 A1* | 3/2012 | Yamashita | ............... C04B 35/49 501/134 |
| 2012/0301668 A1* | 11/2012 | Numano | ................ B32B 15/08 428/138 |

FOREIGN PATENT DOCUMENTS

| JP | 2001-240953 A | 9/2001 | |
| JP | 2008-162164 A | 7/2008 | |
| JP | 2009-264692 A | 11/2009 | |
| JP | 2010-263147 A | 11/2010 | |
| JP | WO 2010140644 A1 * | 12/2010 | ............. C04B 35/49 |
| JP | WO 2011086860 A1 * | 7/2011 | ............. B32B 15/08 |
| WO | 2012/108433 A1 | 8/2013 | |

OTHER PUBLICATIONS

Mech. Eng. (Mechanical Engineering, "Carbon fibre reinforced plastics | carbon fiber reinforced polymers use | CFRP applications," p. 1-6, Apr. 24, 2011).*
Schuetz (Schuetz, "Surface texture from Ra to Rz," Modern Machine Shop, Nov. 1, 2002, p. 1-3).*
TOSOH ("Zirconia", TOSOH, http://www.eskens.com/wp-content/uploads/2014/05/ZIRCONIA-BROCHURE.pdf, p. 1-12, accessed Jun. 17, 2017).*
English Translation of International Preliminary Report on Patentability dated Jun. 18, 2105 issued in International Application No. PCT/JP2013/007159.
International Search Report for PCT/JP2013/007159 dated Mar. 11, 2014 [PCT/ISA/210].

* cited by examiner

NUMBER OF SCRATCHES IS LARGER THAN THAT IN FIG. 2.

COMPOSITE PLATE AND METHOD FOR PRODUCING SAME

CROSS REFERENCE TO RELATED APPLICATIONS

This application is a National Stage of International Application No. PCT/JP2013/007159, filed on Dec. 5, 2013, which claims priority from Japanese Patent Application No. 2012-268398, filed on Dec. 7, 2012, the contents of all of which are incorporated herein by reference in their entirety.

TECHNICAL FIELD

The present invention relates to a composite plate including a zirconia sintered body and a fiber-reinforced plastic and having scratch resistance and impact resistance and to a method for producing the same.

BACKGROUND ART

In recent years, there is an increasing demand for high scratch and impact resistant components for mobile electronic devices typified by smartphones. Particularly, exterior components of mobile electronic devices have a thin plate shape with a thickness of 2 mm or less and must withstand impact such as dropping impact. Therefore, a material having particularly high impact resistance is required for these exterior components.

Materials used for the exterior components may include metals, resins, glasses, etc., and glass materials having scratch resistance and high designability are widely used. The glass materials currently used are tempered glass strengthened by ion exchange. In such tempered glass, a strengthened layer of about several tens of micrometers is formed on the surface of the glass by ion exchange to generate compressive stress on the surface, and propagation of cracks is thereby prevented. However, since the mechanism of strengthening of the tempered glass is due to the strengthened layer, the tempered glass has the following problems, and further improvement is required.

(1) If a crack propagates across the strengthened layer, the tempered glass may break at once.

(2) The Vickers hardness of the glass itself is about 600. Therefore, the glass is easily scratched by contact with metal, concrete, etc., and scratches formed during use may cause a significant reduction in strength.

(3) The tempered glass cannot be machined after the strengthening treatment.

(4) Even when the tempered glass is a chemically strengthened glass, the presence of a machining scratch on an end face may cause a reduction in end face strength.

(5) When the tempered glass breaks, fine sharp broken pieces are formed.

Ceramics are excellent in heat resistance, wear resistance, and corrosion resistance and are therefore widely used for industrial component applications. Particularly, zirconia ceramics have high strength, high toughness, high hardness, and scratch resistance, and their design can be easily improved by coloring. Therefore, the zirconia ceramics are being increasingly used for watch components etc.

The use of ceramics for exterior components of mobile electronic devices etc. is also contemplated. Particularly, when an exterior component of a mobile electronic device is increased in thickness in order to improve impact resistance, the weight of the component becomes large, which is not practically advantageous. When the component is reduced in thickness to reduce the weight, the resistance of the component to impact of falling, collision, etc. becomes insufficient, and the component easily cracks and becomes unusable.

To improve the impact resistance of a ceramic component, methods similar to so-called laminated glass has been proposed (see, for example, Patent Literatures 1 and 2). Specifically, a ceramic plate is joined to a fiber-reinforced plastic to prevent a missile such as a shell or a bullet from piercing the ceramic component. Patent Literature 1 reports a component in which alumina with a thickness of 8 mm and silicon carbide are joined to a fiber-reinforced plastic.

An exterior component of a mobile electronic devices etc. must have resistance to cracking caused by a free falling impact object with a weight close to the own weight of the device (about 100 g). In the conventional method, a thick ceramic component must be used, and this results in an increase in the weight of the component, so that the product cannot be used for a mobile exterior component. To reduce the weight, improvement of cracking resistance must be achieved using a thin plate. However, there has been no impact resistant component that is used for a zirconia plate having a thickness of 2 mm or less and can improve resistance to cracking caused by the impact of falling, collision, etc., and there has been no method for producing such an impact resistant component.

Patent Literature 3 describes a watch cover glass produced by joining sapphire to an inorganic glass. The purpose of this cover glass is, by disposing the high-hardness sapphire on the surface of the watch cover glass, to improve its scratch resistance. However, high impact resistance required for the mobile electronic device applications cannot be achieved by using this method.

Therefore, there has been no impact resistant component that is used for a zirconia sintered body plate having a thickness of several millimeters and has a sufficient white color tone and improved resistance to cracking caused by the impact of falling, collision, etc., and there has been no method for producing such an impact resistant component.

CITATION LIST

Patent Literature

Patent Literature 1: Japanese Patent Application Laid-Open No. 2008-162164
Patent Literature 2: Japanese Patent Application Laid-Open No. 2009-264692
Patent Literature 3: Japanese Patent Application Laid-Open No. 6-242260

SUMMARY OF INVENTION

Technical Problem

When zirconia ceramics are used for components of mobile electronic devices, the components must be increased in thickness in order to improve their impact resistance, and there is still a room for improvement. The present invention relates to a composite plate including a zirconia sintered body and a fiber-reinforced plastic and having impact resistance, particularly improved resistance to cracking caused by impact, and also relates to a method for producing the composite plate. The present invention also relates to, out of composite plates each including a zirconia sintered body and a fiber-reinforced plastic in order to improve impact resistance, particularly resistance to cracking caused by impact, particularly a composite plate excellent in white color tone, and to a method for producing the composite plate.

Solution to Problem

In view of the above problems, the present inventors have conducted detailed studies on a fracture phenomenon of a zirconia thin plate when a steel ball is dropped thereonto. Then the present inventors have found that the impact of the dropped steel ball causes the ceramic plate to bend and a bending moment is thereby generated to cause tensile fracture to occur in the vicinity of the impact point on a side opposite to the impact side. The present inventors have also found that a material having a smaller elastic modulus is more likely to deform largely on impact and absorbs the impact over a long time, so that the absolute value of the maximum tensile stress acting on the side opposite to the impact side is reduced.

The present inventors have conducted extensive studies based on the above findings and found that the impact resistance of a zirconia thin plate can be improved by the following structure, and thus the present invention has been completed. Specifically, a fiber-reinforced plastic is disposed on the rear side of the zirconia thin plate (elastic modulus: 200 GPa), and they are closely fixed to each other. The ability to deform upon impact is thereby imparted to the zirconia thin plate in order to reduce the maximum tensile stress. In this structure, the fiber-reinforced plastic is disposed on the rear side on which tensile stress is generated, and the zirconia thin plate is disposed on the impact side on which compressive stress is mainly generated.

In this composite plate, when the zirconia thin plate is thin, the interior of the composite plate is visible because of the light transmitting properties of the zirconia thin plate, so that designability deteriorates. Therefore, the present inventors have completed a white composite plate excellent in designability by using a white adhesive to closely fix the zirconia thin plate and the fiber-reinforced plastic to each other.

Accordingly, the present invention relates: to a composite plate comprising a laminate including a zirconia sintered body and a fiber-reinforced plastic that are closely fixed to each other, the composite plate having a thickness of 2 mm or less, wherein the ratio of the thickness of the zirconia sintered body to the thickness of the fiber-reinforced plastic (the thickness of the zirconia sintered body/the thickness of the fiber-reinforced plastic) is 0.01 to 1, and the composite plate has an apparent density of 4.3 g/cm$^3$ or less; to a composite plate comprising a laminate including a zirconia sintered body and a fiber-reinforced plastic that are closely fixed to each other, the composite plate having a thickness of 2 mm or less, wherein a maximum roughness depth of a surface of the zirconia sintered body is 50 µm or less per 1 cm$^2$; to a composite plate comprising a laminate including a zirconia sintered body and a fiber-reinforced plastic that are closely fixed to each other with a white adhesive, the composite plate having a thickness of 2 mm or less, wherein the composite plate shows a white color with a surface color (L*, a*, b*) in the range where L* is 86 to 94, a* is −1 to +1, and b* is −1 to +1; and to a method for producing any of the above composite plates.

The present invention will next be described in detail.

The composite plate of the present invention is a composite plate comprising a laminate including a zirconia sintered body and a fiber-reinforced plastic that are closely fixed to each other, the composite plate having a thickness of 2 mm or less. For a reduction in weight, the thickness is preferably 0.1 to 1.5 mm, more preferably 0.15 to 1.0 mm, and particularly preferably 0.15 to 0.60 mm.

In the composite plate of the present invention, the maximum roughness depth of the surface of the zirconia sintered body, i.e., the maximum roughness depth per 1 cm$^2$, is 50 µm or less, preferably 30 µm or less, and more preferably 20 µm or less. By reducing the surface roughness as described above, the zirconia sintered body becomes smooth, and therefore an image specularly reflected from the zirconia sintered body has no distortion, so that designability comparable to that of a bulk (composed only of the zirconia sintered body) can be maintained.

The composite plate of the present invention is a composite plate comprising a laminate of a zirconia sintered body and a fiber-reinforced plastic that are closely fixed to each other with a white adhesive, the composite plate having a thickness of 2 mm or less. The composite plate shows a white color with a surface color (L*, a*, b*) in the range where L* is 86 to 94, a* is −1 to +1, and b* is −1 to +1.

The composite plate of the present invention shows a white color with a surface color (L*, a*, b*) in the range where L* is 86 to 94, a* is −1 to +1, and b* is −1 to +1. Therefore, although the composite plate is a thin plate-shaped composite plate excellent in impact resistance, the composite plate can be a ceramic composite plate having a white color highly suitable for an exterior component and capable of preventing deterioration of decorative value that is caused because the interior of the composite plate is visible.

If the L* value is small, the color becomes dark, and the decorative value deteriorates. If the absolute values of the a* value and b* value are large, the white color becomes a reddish, bluish, yellowish or greenish white color, and the decorative value deteriorates.

In the composite plate of the present invention, the zirconia sintered body and the fiber-reinforced plastic are closely fixed to each other with the white adhesive. To restrain a reduction in white color due to the light transmitting properties of the zirconia sintered body, examples of the white adhesive may include epoxy-based thermosetting adhesives, acrylic-based adhesives that can cure at room temperature, cyanoacrylate adhesives, and ultraviolet-curable resins, and epoxy-based thermosetting adhesives are particularly preferred. The white adhesive is particularly preferably a white adhesive containing a white filler in order to improve the stiffness of the adhesive layer and impart a white color. Examples of the white filler may include alumina and silica.

In the composite plate of the present invention, the ratio of the thickness of the zirconia sintered body to the thickness of the fiber-reinforced plastic (the thickness of the zirconia sintered body/the thickness of the fiber-reinforced plastic) is 0.01 to 1. By setting the ratio of the thickness of the zirconia sintered body to the thickness of the fiber-reinforced plastic to 0.01 to 1, the composite plate is lightweight and is obtained as an impact resistant composite plate excellent in scratch resistance. If the ratio is less than 0.01, sufficient wear resistance is not obtained. If the ratio exceeds 1, the apparent density of the composite becomes high. The ratio is preferably 0.1 to 0.75 and more preferably 0.1 to 0.5, because an increase in the apparent density of the composite plate due to a large thickness of the zirconia sintered body can be restrained to restrain a reduction in impact resistant strength and because a reduction in scratch resistance caused by a reduction in the thickness of the zirconia sintered body can be restrained.

The apparent density of the composite plate of the present invention ($\rho$ (composite plate)) is given by the formula (1) using the true density of the zirconia sintered body ($\rho$ (zirconia)) and the true density of the fiber-reinforced plastic ($\rho$ (fiber-reinforced plastic)).

$$\rho(\text{composite plate}) = \rho(\text{zirconia}) \times \text{volume fraction of zirconia} + \rho(\text{fiber-reinforced plastic}) \times \text{volume fraction of fiber-reinforced plastic} = \rho(\text{zirconia}) \times \text{thickness fraction of zirconia} + \rho(\text{fiber-reinforced plastic}) \times \text{thickness fraction of fiber-reinforced plastic} \quad (1)$$

The density of the fiber-reinforced plastic varies depending on the type of the plastic and the amount of fibers added. The density is generally, for example, 0.9 to 2.45 g/cm$^3$.

When the apparent density of the composite plate of the present invention is 4.3 g/cm$^3$ or less, preferably 0.9 to 4.3 g/cm$^3$, more preferably 2.0 to 4.0 g/cm$^3$, and particularly preferably 2.2 to 3.2 g/cm$^3$, a lightweight feel sufficient for use as an exterior component can be obtained. Since no glass is used, the composite plate is also excellent in safety.

In the composite plate of the present invention, the zirconia sintered body and the fiber-reinforced plastic are closely fixed to each other. Examples of the method for closely fixing them to each other may include: a fixing method using an adhesive; and a method including melting the plastic by heat, a solvent, etc. and allowing the plastic to closely adhere to the zirconia sintered body to fix the plastic thereto. When the adhesive is used, the thickness of the adhesive layer is preferably 200 μm or less, more preferably 100 μm or less, and particularly preferably 50 μm or less. By closely fixing the zirconia sintered body and the fiber-reinforced plastic to each other as described above, they deform together to absorb impact, so that the impact resistance can be improved.

The zirconia sintered body in the composite plate of the present invention is preferably yttria-stabilized zirconia having high strength, wear resistance, and high toughness. When the content of yttria is 2 to 10 mol % with respect to zirconia, the yttria-stabilized zirconia can have high strength, wear resistance, and high toughness. The content of yttria is more preferably 2 to 4 mol %. A stabilizer other than yttria can be used for the zirconia sintered body. Examples of the other stabilizer may include calcia, magnesia, and ceria.

In the composite plate of the present invention, the zirconia sintered body may further contain, for example, a coloring agent to improve its designability. Preferably, the coloring agent contained is, for example, a white pigment such as alumina or a color pigment such as a transition metal oxide. The white pigment used may be an oxide such as alumina, silica, mullite, zinc oxide, or spinel. For a color other than a white color, any general inorganic pigment can be used. For example, spinel-based composite oxides containing transition metals such as Fe, Co, Ni, and Mn and oxides of rare-earth metals such as erbium, neodymium, and praseodymium can be used. For example, zircon including a transition metal added thereto may also be used. An oxide of a transition metal such as nickel or iron can also be used as the pigment.

In the composite plate of the present invention, the zirconia sintered body has a relative density of preferably 97% or more. The relative density is more preferably 98% or more and still more preferably 99% or more, in order to further improve the scratch resistance and to suppress a reduction in designability of a mirror-finished surface of the sintered body due to roughness of the surface caused by residual pores.

In the composite plate of the present invention, the zirconia sintered body has a Vickers hardness of preferably 1,000 or more, more preferably 1,100 or more, still more preferably 1,200 or more, and particularly more preferably 1,400 or more in order to obtain sufficient scratch resistance.

Examples of the fiber-reinforced plastic used in the composite plate of the present invention may include glass fiber-reinforced plastics, carbon fiber-reinforced plastics, aromatic polyamide fiber-reinforced plastics, and cellulose fiber-reinforced plastics. Of these, carbon fiber-reinforced plastics and glass fiber-reinforced plastics, which can be easily utilized industrially, are preferred. For components required to have radio wave permeability, glass fiber-reinforced plastics are preferred.

Examples of the plastic used for the fiber-reinforced plastics may include thermosetting unsaturated polyester resins, epoxy resins, polyamide resins, phenolic resins, acrylic resins, silicones, polysulfones, polyethersulfones, and PET.

Examples of the fibers that reinforce the plastic may include glass fibers, carbon fibers, cellulose fibers, aramid fibers, boron fibers, and polyethylene fibers. In one exemplary method, these fibers are finely cut and sprinkled over the resin uniformly. In another method, the plastic is infiltrated into the fibers while they are allowed to maintain their directions.

The composite plate of the present invention has high impact resistance (cracking resistance). Specifically, when the composite plate is subjected to an impact test in which a steel ball of 130 g is freely dropped from a given height onto the composite plate bonded to an aluminum alloy using a 0.1 mm-thick double-sided tape, the impact resistance value, i.e., the height that causes a crack to occur in the zirconia sintered body (fracture height), is 10 cm or more, preferably 15 cm or more, and more preferably 20 cm or more. When the composite plate is used for the case of a mobile electronic device, resistance to the impact of falling, collision, etc. can be imparted to the case when the fracture height is 10 cm or more.

A method for producing the composite plate of the present invention will next be described in detail.

The composite plate of the present invention can be produced, for example, by bonding a thin plate formed from the zirconia sintered body and a fiber-reinforced plastic using an adhesive at a temperature of 300° C. or lower. Examples of the adhesive used for bonding may include adhesives such as epoxy-based thermosetting adhesives, acrylic-based adhesives that cure at room temperature, cyanoacrylate adhesives, and ultraviolet-curable resins. An epoxy-based thermosetting adhesive is preferably used because high bonding strength is obtained between the zirconia sintered body and the fiber-reinforced plastic and because the heat resistance and impact resistance of the adhesive are high. A filler such as inorganic particles may be added to the adhesive to improve the stiffness of the adhesive layer. To achieve higher bonding strength, it is preferable to subject the bonding surfaces to ultraviolet/ozone treatment or plasma treatment to clean the surfaces. The bonding surface of the zirconia may be cleaned by heating.

The fiber-reinforced plastic may be melted by heat or a solvent and then fused to the zirconia thin plate. Alternatively, the joined body can be obtained by placing the zirconia thin plate in a die and then pouring the fiber-reinforced plastic with flowability imparted thereto into the die to fuse them. In addition, the composite body can also be obtained by bringing a prepreg including impregnated fibers into intimate contact with zirconia and then curing the prepreg by ultraviolet rays or heat to form a polymer.

In the method for producing a thin plate of the zirconia sintered body in the composite plate of the present invention, the thin plate can be produced using a general ceramic molding process. Examples of the molding process may include a pressing method, an extrusion method, a slip casting method, an injection molding method, and a sheet molding method. Of these, a sheet molding method using a doctor blade is preferred. Specifically, a slurry prepared by mixing zirconia powder and an organic binder is formed into a green sheet having a thickness of 1 mm or less using a doctor blade, and the green sheet is sintered at 1,300 to 1,500° C. to obtain a zirconia sintered body. Then the zirconia sintered body is bonded to the fiber-reinforced plastic, and the surface of the zirconia sintered body is ground and polished, whereby the composite plate can be produced. The sintering is performed generally in air, but vacuum sintering, hot-pressing, a hot isostatic pressing (HIP) method, etc. may also be used.

Preferably, the zirconia sintered body used in the composite plate of the present invention has a mirror polished front surface. Preferably, as the surface roughness of the mirror surface, Ra (arithmetic mean height) is 0.1 μm or less. The arithmetic mean height is a value obtained by extracting a reference length in an average line direction from a roughness curve, summing the absolute values of deviations of the measured curve in the extracted portion from the average line, and averaging the absolute values. The maximum roughness depth of the surface of the zirconia sintered body joined to the fiber-reinforced plastic is 50 μm or less per 1 cm². When the zirconia bonded to the fiber-reinforced plastic is ground and polished, warpage and distortion easily occur due to residual stress caused by the processing. Therefore, preferably, the zirconia is processed into the final shape before bonding, and the flattened zirconia is bonded to the fiber-reinforced plastic. When the zirconia bonded to the fiber-reinforced plastic is machined, it is preferable to grind and polish the zirconia under such conditions that the amount of residual stress remaining is as small as possible.

The maximum height (Ry) is the height from the lowest valley bottom to the maximum peak within the reference length, and Ry is preferably 10 μm or less. A ten-point average roughness (Rz) is the average of the heights of five highest peak points selected and the heights of five lowest valley points selected within the reference length, and Rz is preferably 5 μm or less.

Advantageous Effects of Invention

The composite plate of the present invention has a thin plate shape, has high impact resistance and high scratch resistance, and can therefore be used for case components for mobile electronic devices such as smartphones, tablet terminal devices, notebook PCs, and small music players. The composite plate can also be used for components of input devices such as touch pads. The composite plate using a glass fiber-reinforced plastic has high radio wave permeability and can therefore be used for components such as protective members of antennas. When colored zirconia is used, the design of the composite plate can be easily improved, and therefore the composite plate can also be used for watch components.

DESCRIPTION OF EMBODIMENTS

Figure 1:
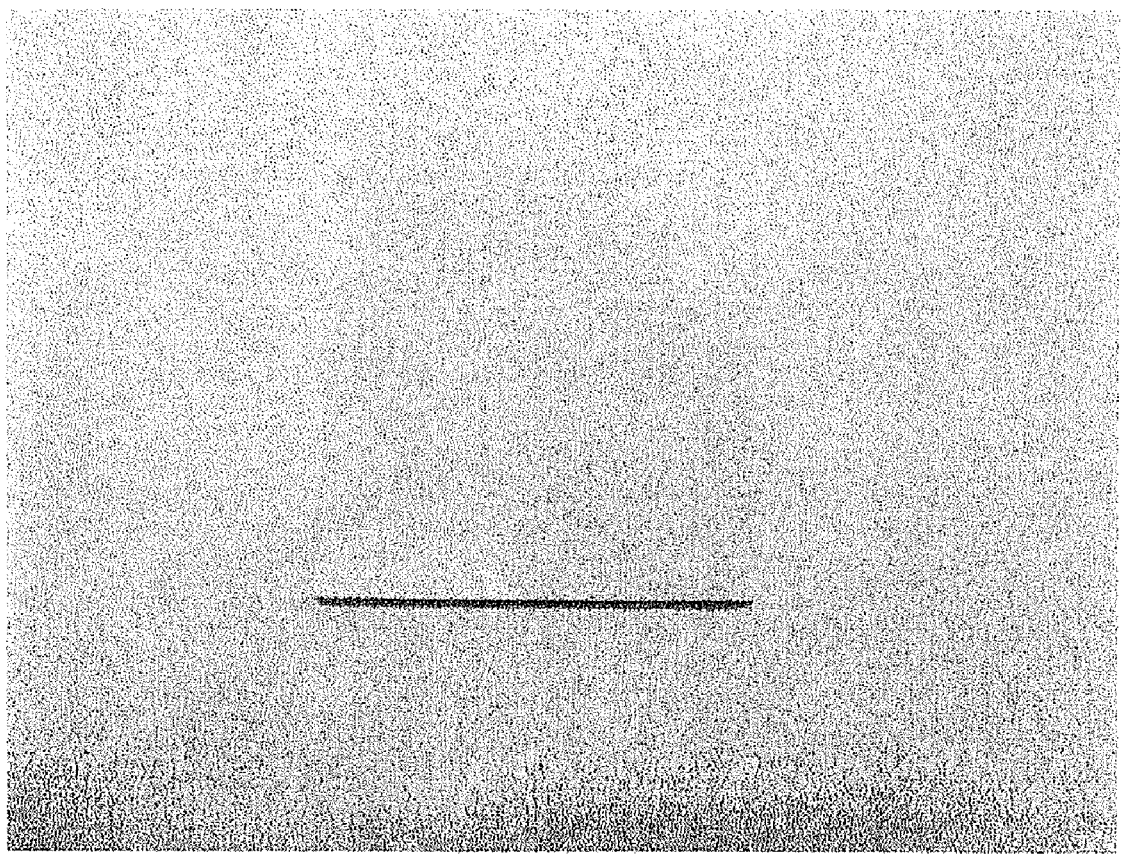
FIG. 1 is a diagram illustrating an external appearance of a zirconia composite plate obtained in Example 4.

Hereinafter, the present invention will be specifically described by way of Examples and Comparative Examples.
(Relative Density)

The density of a sample, a collection of five zirconia sintered bodies, was measured using the Archimedes method. The obtained density was used to determine the relative density with respect to the true density. The true densities of sintered bodies obtained by sintering powders used in the following Examples and Comparative Examples are as follows. The true density of a sintered body using a white zirconia powder (3YS20A) is 5.51 g/cm³. The true density of a sintered body using a black zirconia powder (product name "TZ-Black," manufactured by TOSOH Corporation) is 6.06 g/cm³. The true density of a sintered body using a zirconia powder (product name "3YSE," manufactured by TOSOH Corporation) is 6.09 g/cm³.

Note that the 3YS20A is a system prepared by adding 20 wt % of alumina to zirconia containing 3 mol % of yttria, the TZ-Black is a system prepared by adding a spinel compound-based black pigment to zirconia containing 3 mol % of yttria, and the 3YSE is a system prepared by adding 0.25 wt % of alumina serving as an auxiliary agent to zirconia containing 3 mol % of yttria.
(Measurement of Impact Strength)

The impact strength of a composite plate was evaluated using a steel ball drop test. A method similar to ISO14368-3 in the specifications of "Dimensions of watch glass and test method" was used for the steel ball drop test. Specifically, one of the composite plates obtained in the Examples and Comparative Examples was secured to a 5 mm-thick flat aluminum alloy (50 mm×52 mm) using a 0.1 mm-thick double-sided tape (product number "4511-100," manufactured by 3M). Then a steel ball of 130 g was freely dropped onto the central position of the composite plate from a given height, and the height that caused the composite plate to break was measured. The impact surface used was a mirror polished surface in which a surface roughness Ra is 0.02 μm or less.

(Measurement of Bending Strength)

The bending strength of a composite plate was measured according to biaxial bending strength measurement (ISO/DIS6872). The measurement was performed as follows. The radius of a support was set to 6 mm, and the center of the composite plate was placed on the support with the zirconia surface facing up and the fiber-reinforced plastic surface on the rear side. An indenter was placed such that a load was applied to the center of the zirconia surface. To compute the bending strength, a reduced diameter using a flat plate area was used. The zirconia used had mirror-polished opposite surfaces in which a surface roughness Ra is 0.02 µm or less.

(Measurement of Surface Shape)

The surface roughness of a composite plate in a three-dimensional shape measurement was evaluated using Zygo New View 7100. The surface roughness per 1 $cm^2$ was measured in an area around the center of the test piece. In Comparative Example 1 in which undulations were large, an optical microscope was used to measure focal lengths to thereby measure the surface shape.

(Apparent Density)

An apparent density was computed from the ratio of zirconia to a glass fiber-reinforced resin. In this case, 5.47 $g/cm^3$ (relative density: 99.3%) was used for the density of the zirconia (3YS20A), and 2.0 $g/cm^3$ was used for the density of the glass fiber-reinforced plastic.

Examples 1 to 3

A white zirconia powder (product name "3YS20A," manufactured by TOSOH Corporation) was molded at a pressure of 50 MPa using a die press. The obtained compact was further molded using a cold isostatic press (CIP) at a pressure of 200 MPa.

The obtained compact was heated in air at a temperature rising speed of 100° C./h to 1,500° C. and held at 1,500° C. for 2 hours to sinter the compact. The properties of the obtained sintered body are shown in TABLE 3 as a Reference Example. The opposite sides of the obtained sintered body were grounded and polished to obtain a zirconia thin plate having a prescribed thickness. Hv10 in TABLE 3 represents a Vickers hardness measured using an indenter load of 10 kgf.

The surface of the obtained zirconia thin plate and the surface of an epoxy resin-based glass fiber-reinforced plastic (epoxy/glass cloth laminate SL-EC, manufactured by Nitto Shinko Corporation) were washed with acetone. Then an epoxy-based thermosetting resin (product number "XN1245SR," manufactured by Nagase ChemteX Corporation) was uniformly applied to a surface to be bonded, and the zirconia thin plate and the glass fiber-reinforced plastic were bonded together under the condition of 120° C. for 30 minutes with a load uniformly applied to the upper and lower surfaces of the composite plate. The thicknesses of the respective layers of each of the obtained composite plates are shown in TABLE 1. Each of the obtained composite plates was cut into pieces of 32 mm×25 mm. No separation of the adhesive and no chipping of the zirconia due to machining were found, and the workability was high. The properties of the glass fiber-reinforced plastic used are shown in TABLE 4 as a Reference Example. To compute the apparent density, 2.0 $g/cm^3$ was used as the density of the reinforced plastic.

The results of evaluation of each of the obtained composite plates are shown in TABLE 1. The apparent densities of all the composite plates were 4.3 $g/cm^3$ or less, and all the composite plates had a Vickers hardness of 1,000 or more.

The steel ball drop test was performed in steps of 5 cm. The results were 10 cm or more for all the cases, showing high impact resistance. Another steel ball drop test was performed. Specifically, the steel ball was dropped once from a height of 30 cm and once from a height 50 cm onto an undamaged portion of each tested test piece. The impact resistance was higher than that evaluated in steps of 5 cm. The high value may be because interfacial separation of the adhesive layer caused by the repeated impact test did not occur.

Examples 4 to 10

A white zirconia sintered body (3YS20A) was obtained by the same method as in Example 1. No separation of the adhesive and no chipping of the zirconia due to machining were found, and the workability was high. A photograph of the obtained composite is shown in FIG. 1. One side of the obtained white zirconia sintered body was ground, and the ground side was mirror-polished.

Next, the mirror-polished surface of the zirconia sintered body and the glass fiber-reinforced plastic were bonded together using an epoxy-based thermosetting resin (product number "XN1245SR," manufactured by Nagase ChemteX Corporation) under the condition of 120° C. for 30 minutes with a load uniformly applied to the upper and lower surfaces of the composite plate. Each of the obtained composite plates was cut into a shape of 32 mm×25 mm, and the ceramic side was ground and mirror-polished such that the total thickness of the zirconia sintered body, the adhesive, and the fiber-reinforced plastic was about 0.8 mm.

The results of evaluation of the obtained composite plates are shown in TABLE 1. The apparent densities of all the composite plates were 4.3 $g/cm^3$ or less, and all the composite plates had a Vickers hardness of 1,000 or more. The results of the steel ball drop test performed under the same conditions as in Example 1 are shown in TABLE 1. The results of the impact resistance test were 10 cm or more for all the cases, showing high impact resistance.

Examples 11 to 12

Zirconia composite plates were obtained using the same method as in Example 4 except that one of room temperature curable acrylic-based adhesives (G55-03 and NS-700M-20, manufactured by Denki Kagaku Kogyo Kabushiki Kaisha) was used as the adhesive and the adhesive was uniformly applied to a surface to be bonded and cured for bonding at room temperature for a whole day and night with a load uniformly applied to the upper and lower surfaces of the composite plate. The results of evaluation of the obtained composite plates are shown in TABLE 1. The impact resistance was high, i.e., 10 cm or more for all the composite plates.

Examples 13 to 18

Zirconia composite plates were obtained using the same method as in Example 4 except that, before the zirconia plate and the glass fiber-reinforced plastic were bonded together, their surfaces to be bonded were washed with acetone and irradiated with ultraviolet-induced ozone to perform cleaning treatment and then the surfaces subjected to the cleaning treatment were bonded together using an epoxy adhesive. The results of evaluation of the obtained composite plates are shown in TABLE 1. It was found that the composite plates irradiated with ultraviolet-induced ozone showed high impact resistance.

Examples 19 to 25

Each of a zirconia powder (product name "3YSE," manufactured by TOSOH Corporation) and a black zirconia powder (product name "TZ-Black," manufactured by TOSOH Corporation) was molded using a die press at a pressure of 50 MPa. Each of the obtained compacts was further molded using a cold isostatic press (CIP) at a pressure of 200 MPa.

Next, to sinter the 3YSE, its temperature was increased to 1,450° C. in air at a temperature rising speed of 100° C./h, and the temperature was held at 1,450° C. for 2 hours. To sinter the TZ-Black, its temperature was increased to 1,400° C. at a temperature rising speed of 100° C./h, and the temperature was held at 1,400° C. for 1 hour. The properties of the obtained sintered bodies are shown in TABLE 3 as Reference Examples. The opposite sides of each of the obtained sintered bodies were ground and mirror-polished to obtain a zirconia thin plate having a prescribed thickness. The obtained zirconia thin plate was bonded to the glass fiber-reinforced plastic using the same method as in Example 4 to obtain a composite plate.

The apparent densities of all the composite plates were 4.3 g/cm$^3$ or lower, and all the composite plates had a Vickers hardness of 1,000 or more. The results of the steel ball drop test performed under the same conditions as in Example 1 are shown in TABLE 1. The results of the impact resistance test were 10 cm or more for all the cases, showing high impact resistance.

Examples 26 to 31

Zirconia sintered bodies were obtained using one of 3YS20A, 3YSE, and TZ-Black powders. Each of the zirconia sintered bodies was subjected to hot isostatic press (HIP) to obtain a zirconia thin plate, and a composite plate was produced using the zirconia thin plate.

Specifically, the 3YS20A, 3YSE, and TZ-Black sintered bodies were produced according to Examples 4, 19, and 22, respectively, and then subjected to HIP treatment under the conditions of an argon gas atmosphere and 150 MPa. The temperature of the HIP treatment was 1,450° C. for 1 hour for the 3YS20A and 3YSE and was 1,350° C. for 1 hour for the TZ-Black. The sintered bodies subjected to the HIP treatment were subjected to tempering treatment under the condition of 1,000° C. for 1 hour, and composite plates were produced using the same method as in Example 4. After the HIP treatment, the relative densities of all the sintered bodies reached 100%.

The results of the impact resistance test on the obtained composite plates are shown in TABLE 1. It was found that the composite plates using the HIP-treated zirconia sintered bodies showed higher impact resistance.

Examples 32 to 35

Zirconia composite plates were produced using the same method as in Example 1 except that a carbon fiber-reinforced plastic (manufactured by CFD Co., Ltd.) was used. The properties of the carbon fiber-reinforced plastic used are shown in TABLE 4 as a Reference Example. The density of the carbon fiber-reinforced plastic was 1.5 g/cm$^3$. The results of the steel ball drop test performed on the obtained composite plates in steps of 5 cm are shown in TABLE 1. The results of the impact resistance test were 10 cm or more for all the cases, showing high impact resistance.

Example 36

A composite plate was produced under the same conditions as in Example 4. The thickness of the sintered body was 0.239 mm, the thickness of the glass fiber-reinforced resin was 0.501 mm, and the thickness of the adhesive layer was 31 µm. The ratio of the thickness of the zirconia sintered body to the thickness of the fiber-reinforced plastic was 0.48. The apparent density of the composite plate was 3.00 g/cm$^3$, and its Vickers hardness was 1,430.

A steel ball drop test was performed on the obtained composite plate. Specifically, the evaluation was performed on a region 1 mm away from an end face of the composite toward the center of the test piece. No cracking was observed even when the steel ball was dropped from 15 cm, and the composite plate showed high impact resistant strength even at the edge.

Example 37

A composite plate was produced using the same method as in Example 4. The thickness of the sintered body was 0.210 mm, the thickness of the glass fiber-reinforced resin was 0.510 mm, and the thickness of the adhesive layer was 35 µm. The ratio of the thickness of the zirconia sintered body to the thickness of the fiber-reinforced plastic was 0.41. The apparent density of the composite plate was 2.87 g/cm$^3$, and its Vickers hardness was 1,430.

Figure 2:
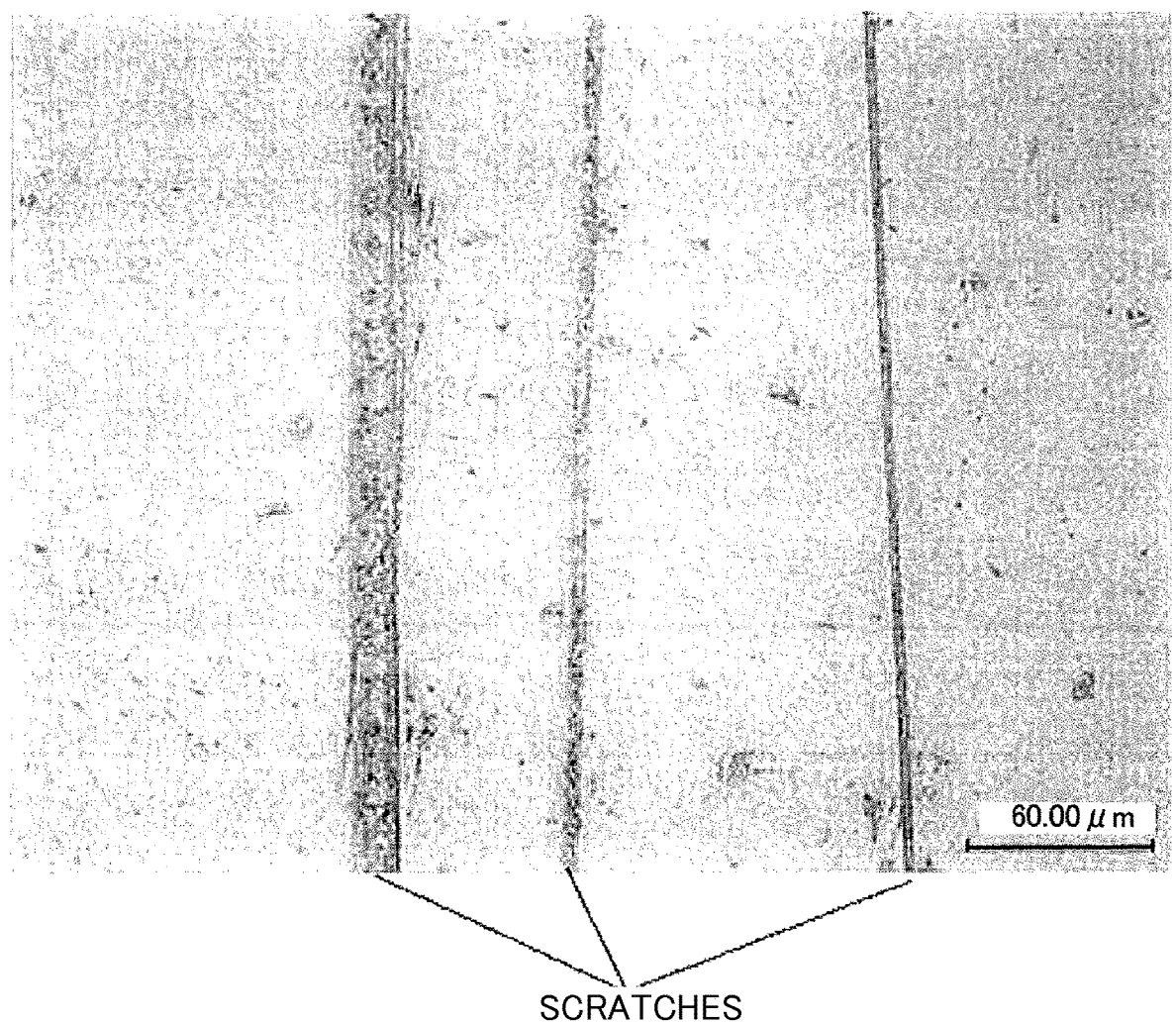
FIG. 2 is a micrograph showing the surface of a zirconia composite plate obtained in Example 37 and subjected to scratching treatment.

100 sand paper was placed on the zirconia surface of the composite plate, and an iron-made weight of 3 kg was used to apply a load. The iron-made weight was moved a distance of 30 cm on the sand paper back and forth 5 times to scratch the zirconia surface. The steel ball fracture height was 20 cm and remained unchanged before and after the scratching treatment, and no reduction in impact strength due to the scratching treatment was found. A micrograph of the zirconia surface after the scratching treatment is shown in FIG. 2. The surface roughnesses of the zirconia after the scratching were 0.13 as Ra and 2.73 as Rz, and it was found that the composite plate of the present invention has high resistance to scratching.

Example 38

A 3YS20A composite plate of 32 mm×25 mm was produced using the same method as in Example 4, and its bending strength was measured. The thickness of the sintered body was 0.257 mm, the thickness of the glass fiber-reinforced resin was 0.525 mm, and the thickness of the adhesive layer was 19 µm. The ratio of the thickness of the zirconia sintered body to the thickness of the fiber-reinforced plastic was 0.49. The apparent density of the composite plate was 3.07 g/cm$^3$, and its Vickers hardness was 1,430.

The bending strength was high, i.e., 800 MPa. The bending elastic modulus was estimated from the load-displacement curve in the test and found to be about 40 GPa. This value is significantly lower than the elastic modulus of the zirconia (250 GPa).

Example 39

Figure 3:
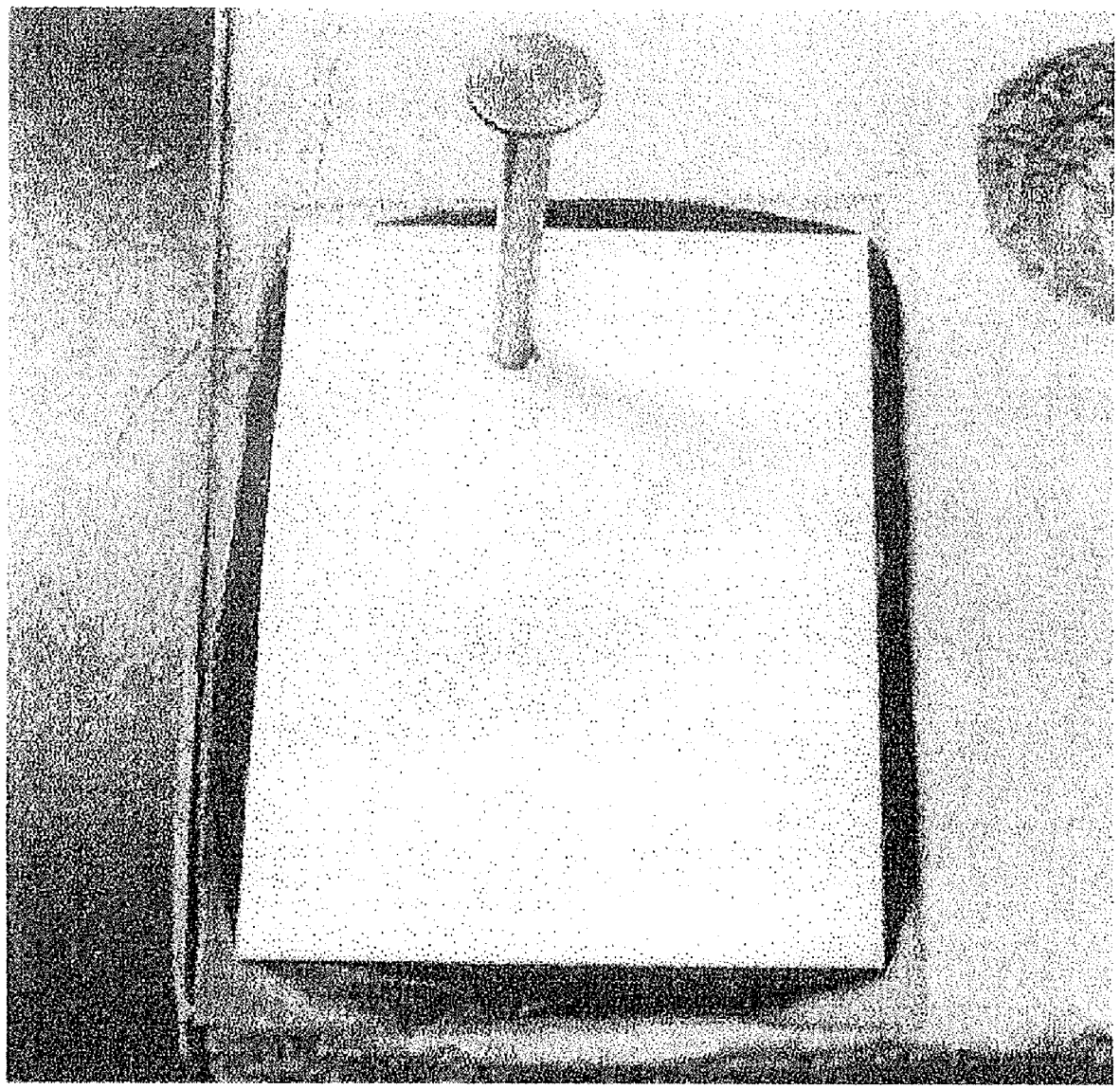
FIG. 3 is a diagram illustrating the state of a zirconia composite plate obtained in Example 39 and subjected to a nail penetration test.

A composite plate prepared by bonding the 3YS20A (32 mm×25 mm) to the glass fiber-reinforced plastic using the same method as in Example 4 was subjected to a nail penetration test. The thickness of the sintered body was 0.198 mm, the thickness of the glass fiber-reinforced resin was 0.504 mm, and the thickness of adhesive layer was 45 μm. The ratio of the thickness of the zirconia sintered body to the thickness of the fiber-reinforced plastic was 0.39. The apparent density of the composite plate was 2.80 g/cm$^3$, and its Vickers hardness was 1,430. Cracks did not propagate throughout the composite plate even after penetration of the nail, and a through hole was formed only around the nail. The appearance of the composite plate after the nail penetration test is shown in FIG. 3.

Example 40

700 g of TZ-3YS powder, 14 g of a commercial polycarboxylate macromolecular dispersant used as a dispersant, 3.5 g of commercial polyethylene glycol mono-para-isooctylphenyl ether used as an antifoaming agent, 245 g of ethyl acetate and 245 g of n-butyl acetate used as solvents, 49 g of butyral resin (degree of polymerization: about 1,000) powder used as a binder, and 42 g of industrial dioctyl phthalate used as a plasticizer were added to a ball mill and mixed for 48 hours. PET was used as a carrier film, and a green sheet was formed on the carrier film using a doctor blade device and a blade.

The obtained green sheet was placed on a porous alumina setter and sintered with an alumina setter used as a weight placed on the green sheet. During the sintering, temperature was increased from room temperature to 450° C. at a temperature rising speed of 5° C./h and held at 450° C. for 10 hours to perform degreasing. Then the temperature was increased from 450° C. to 1,000° C. at a temperature rising speed of 50° C./h and held at 1,000° C. for 5 hours. Then the temperature was held at 1,450° C. for two hours to perform sintering. The relative density of the obtained sintered body was 99% or higher.

The obtained sintered body was bonded to a 0.501 mm-thick glass fiber-reinforced plastic of 32 mm×25 mm using an epoxy-based thermosetting resin (product number "XN1245SR," manufactured by Nagase ChemteX Corporation) in the same manner as in Example 1. The zirconia surface of the bonded composite plate was ground and polished to produce a composite plate.

The thickness of the sintered body was 0.234 mm, and the thickness of the adhesive layer was 32 μm. The ratio of the thickness of the zirconia sintered body to the thickness of the fiber-reinforced plastic was 0.47. The apparent density of the composite plate was 3.15 g/cm$^3$, and its Vickers hardness was 1,430. An impact resistance test was performed using a falling steel ball in the same manner as in Example 1 (in steps of 5 cm). The results showed that the fracture height of the composite plate was 20 cm.

Comparative Example 1

The 3YS20A was used to produce a composite plate using the same method as in Example 1. In this composite plate, the ratio of the thickness of the zirconia sintered body to the thickness of the glass fiber-reinforced plastic was 2.56. The results are shown in TABLE 2. The apparent density of the composite plate was larger than 4.3 g/cm$^3$.

Comparative Example 2

The 3YS20A was used to produce a plate using the same method as in Example 1. In this plate, the zirconia sintered body and the glass fiber-reinforced plastic were laminated without using the adhesive. Then the plate was subjected to the steel ball drop test, and the results are shown in TABLE 2. When the zirconia sintered body was not bonded to the glass fiber-reinforced plastic but was placed directly thereon, the plate broke at 5 cm, and it was found that the impact resistance characteristics were significantly low.

Comparative Example 3

The 3YS20A was used to produce a composite plate using the same method as in Example 1 except that an ABS resin was used instead of the glass fiber-reinforced plastic. The results of the steel ball drop test on this composite plate are shown in TABLE 2. The composite plate using the ABS resin broke at 5 cm, and it was found that the impact resistance characteristics were significantly low.

Comparative Example 4

A steel ball of 130 g was dropped onto a 0.7 mm-thick aluminosilicate-based tempered glass (32 mm×25 mm) at a position 1 mm away from an end face toward the center of the base material. Fracture occurred near the end face at 5 cm.

Comparative Example 5

Figure 4:
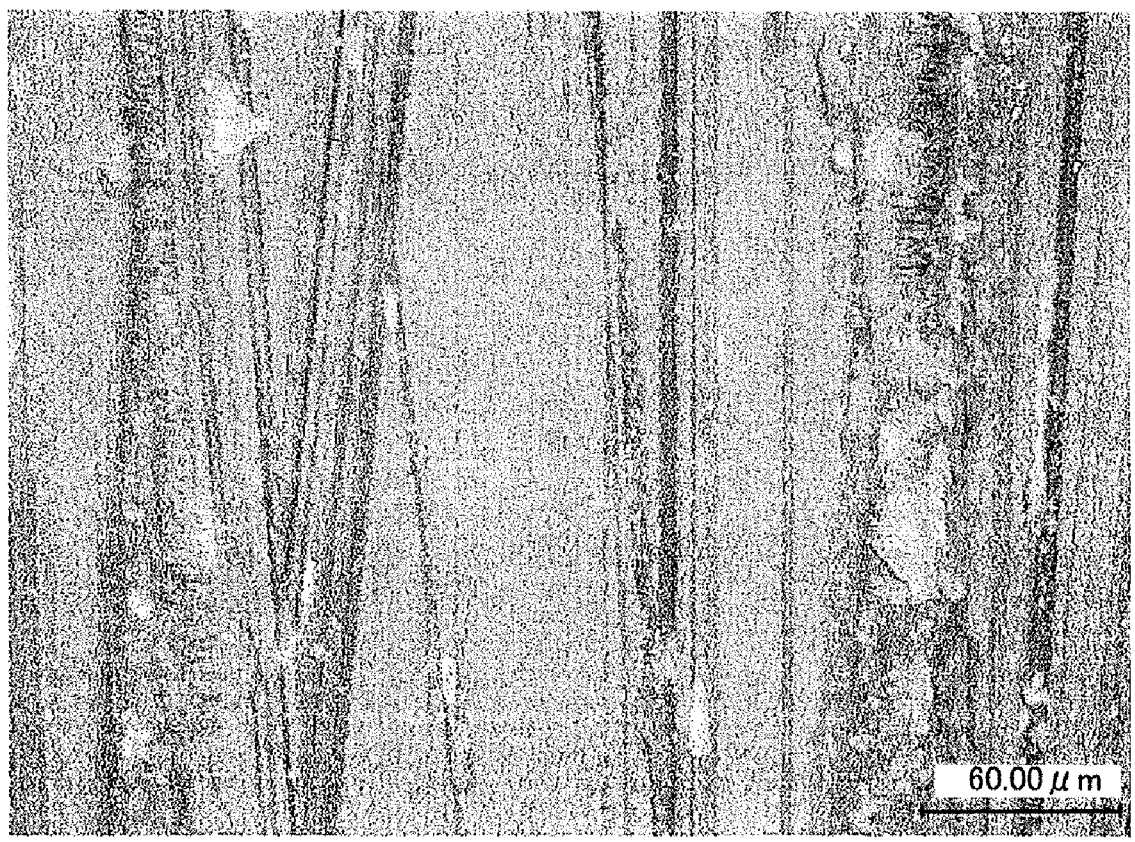
FIG. 4 is a micrograph showing the surface of an aluminosilicate-based tempered glass used in Comparative Example 5 and subjected to scratching treatment.

The surface of an aluminosilicate-based tempered glass (32 mm×25 mm, thickness: 0.7 mm) was subjected to scratching treatment using the same method as in Example 23, and impact resistance was evaluated before and after the scratching treatment. The falling steel ball fracture strength was 30 cm before the scratching treatment, and the steel ball fracture height became 10 cm after the scratching treatment. The surface roughnesses after the scratching were 0.8 μm as Ra and 6.72 μm as Ry. A photograph of the surface of the scratching-treated glass is shown in FIG. 4.

Comparative Example 6

Figure 5:
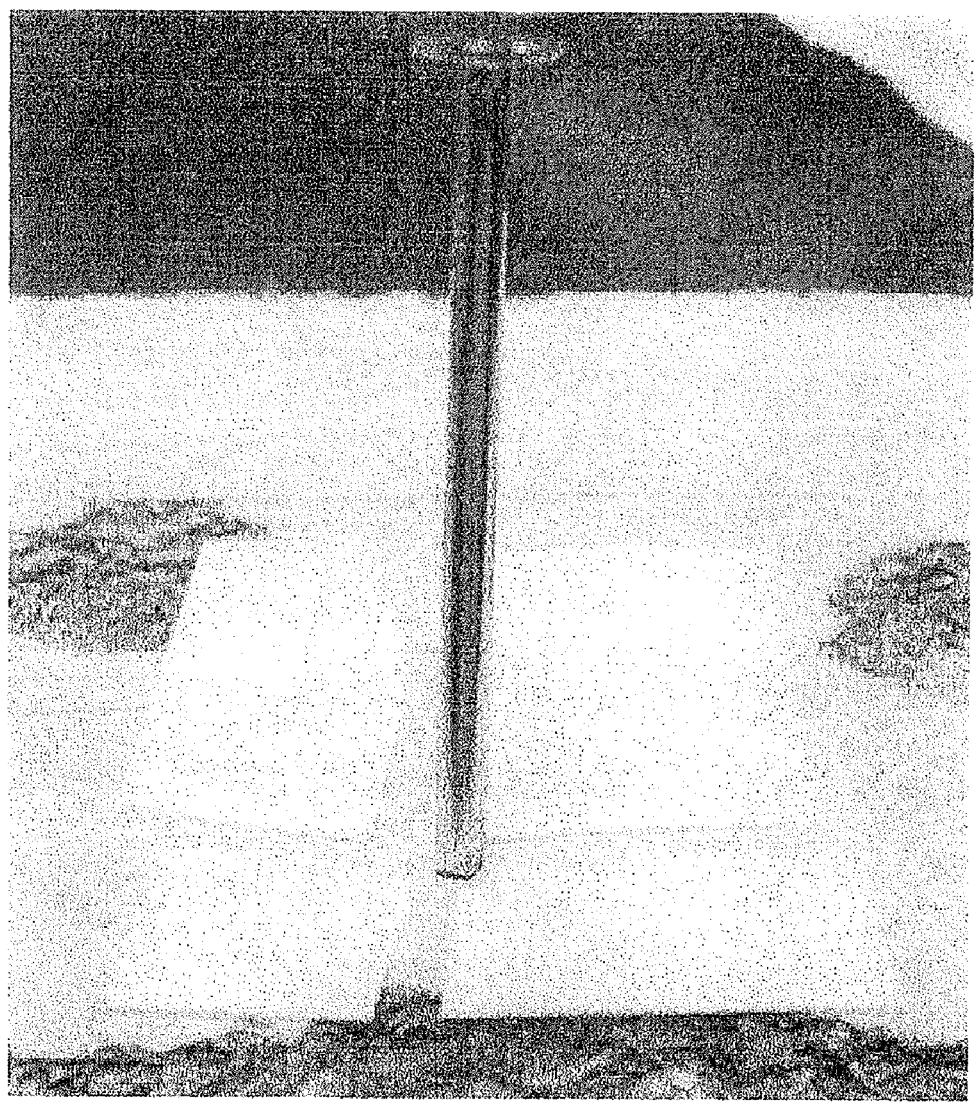
FIG. 5 is a diagram illustrating the state of a base material (a white zirconia sintered body) in Comparative Example 6 after a nail penetration test.

A white zirconia sintered body was produced under the conditions described in Example 1. The opposite sides of the sintered body were polished to obtain a zirconia thin plate having a thickness of 0.2 mm, and a nail penetration test was performed on the zirconia thin plate. In the zirconia thin plate, penetration of the nail caused cracks to propagate over the entire sintered body, and the base material broke into several pieces. The appearance of the base material after the nail penetration test is shown in FIG. 5.

Comparative Example 7

A composite plate was produced using a sapphire thin plate instead of the zirconia under the conditions described in Example 1. The thickness of the sapphire was 0.218 mm, and the thickness of the adhesive layer was 45 μm. The thickness of the glass fiber-reinforced plastic was 0.527 mm. This composite plate was evaluated using the method described in Example 1. The results showed that the composite plate broke at 5 cm. Since the elastic modulus of the sapphire (elastic modulus: 400 GPa) is higher than that of the zirconia, the ability of the sapphire to deform upon impact is insufficient. Therefore, high tensile stress may occur on the sapphire side.

TABLE 1

| | TYPE OF ZIRCONIA | THICKNESS | | | | RATIO ZIRCONIA/FRP | APPARENT DENSITY g/cm³ | VICKERS HARDNESS Hv10 | STEEL BALL FRACTURE HEIGHT | | |
|---|---|---|---|---|---|---|---|---|---|---|---|
| | | ZIRCONIA mm | FRP mm | ADHESIVE LAYER mm | TOTAL mm | | | | STEPS OF 5 CM (cm) | 30 cm | 50 cm |
| EXAMPLE 1 | 3YS20A | 0.141 | 0.511 | 0.031 | 0.683 | 0.28 | 2.63 | 1430 | 15 | OK | CRACKED |
| EXAMPLE 2 | 3YS20A | 0.171 | 0.516 | 0.034 | 0.721 | 0.33 | 2.73 | 1430 | 15 | OK | CRACKED |
| EXAMPLE 3 | 3YS20A | 0.162 | 0.512 | 0.014 | 0.688 | 0.32 | 2.78 | 1430 | 30 | OK | CRACKED |
| EXAMPLE 4 | 3YS20A | 0.256 | 0.524 | 0.022 | 0.802 | 0.49 | 3.05 | 1430 | 20 | OK | CRACKED |
| EXAMPLE 5 | 3YS20A | 0.271 | 0.521 | 0.023 | 0.815 | 0.52 | 3.10 | 1430 | 15 | OK | CRACKED |
| EXAMPLE 6 | 3YS20A | 0.287 | 0.524 | 0.013 | 0.824 | 0.55 | 3.18 | 1430 | 20 | OK | OK |
| EXAMPLE 7 | 3YS20A | 0.275 | 0.518 | 0.008 | 0.801 | 0.53 | 3.17 | 1430 | 15 | OK | CRACKED |
| EXAMPLE 8 | 3YS20A | 0.247 | 0.551 | 0.012 | 0.810 | 0.45 | 3.03 | 1430 | 20 | OK | CRACKED |
| EXAMPLE 9 | 3YS20A | 0.266 | 0.524 | 0.009 | 0.799 | 0.51 | 3.13 | 1430 | 25 | OK | OK |
| EXAMPLE 10 | 3YS20A | 0.253 | 0.519 | 0.194 | 0.966 | 0.49 | 2.51 | 1430 | 20 | OK | CRACKED |
| EXAMPLE 11 | 3YS20A | 0.298 | 0.521 | 0.010 | 0.829 | 0.57 | 3.22 | 1430 | 15 | CRACKED | — |
| EXAMPLE 12 | 3YS20A | 0.204 | 0.563 | 0.012 | 0.779 | 0.36 | 2.88 | 1430 | 20 | OK | CRACKED |
| EXAMPLE 13 | 3YS20A | 0.266 | 0.517 | 0.018 | 0.801 | 0.51 | 3.11 | 1430 | 20 | OK | OK |
| EXAMPLE 14 | 3YS20A | 0.246 | 0.521 | 0.018 | 0.785 | 0.47 | 3.04 | 1430 | 15 | OK | OK |
| EXAMPLE 15 | 3YS20A | 0.255 | 0.517 | 0.025 | 0.797 | 0.49 | 3.05 | 1430 | 20 | OK | OK |
| EXAMPLE 16 | 3YS20A | 0.278 | 0.517 | 0.024 | 0.819 | 0.54 | 3.12 | 1430 | 25 | OK | OK |
| EXAMPLE 17 | 3YS20A | 0.133 | 0.516 | 0.021 | 0.670 | 0.26 | 2.63 | 1430 | 40 | OK | OK |
| EXAMPLE 18 | 3YS20A | 0.086 | 0.525 | 0.013 | 0.624 | 0.16 | 2.44 | 1430 | 50 | OK | OK |
| EXAMPLE 19 | 3YSE | 0.169 | 0.521 | 0.018 | 0.708 | 0.32 | 2.92 | 1240 | 50 | OK | OK |
| EXAMPLE 20 | 3YSE | 0.175 | 0.522 | 0.018 | 0.715 | 0.34 | 2.95 | 1240 | 50 | OK | OK |
| EXAMPLE 21 | 3YSE | 0.210 | 0.523 | 0.018 | 0.751 | 0.40 | 3.09 | 1240 | 40 | OK | OK |
| EXAMPLE 22 | TZ-Black | 0.270 | 0.517 | 0.021 | 0.808 | 0.52 | 3.28 | 1240 | 20 | OK | OK |
| EXAMPLE 23 | TZ-Black | 0.238 | 0.520 | 0.021 | 0.779 | 0.46 | 3.17 | 1240 | 25 | OK | OK |
| EXAMPLE 24 | TZ-Black | 0.127 | 0.665 | 0.014 | 0.806 | 0.19 | 2.73 | 1240 | 50 | OK | OK |
| EXAMPLE 25 | TZ-Black | 0.175 | 0.714 | 0.017 | 0.906 | 0.24 | 2.94 | 1240 | 50 | OK | OK |
| EXAMPLE 26 | 3YS20AHIP | 0.224 | 0.521 | 0.021 | 0.766 | 0.43 | 2.97 | 1430 | 50 | OK | OK |
| EXAMPLE 27 | 3YS20AHIP | 0.214 | 0.522 | 0.029 | 0.765 | 0.41 | 2.91 | 1430 | 35 | OK | OK |
| EXAMPLE 28 | 3YSEHIP | 0.179 | 0.521 | 0.025 | 0.725 | 0.34 | 2.94 | 1240 | 50 | OK | OK |
| EXAMPLE 29 | 3YSEHIP | 0.188 | 0.521 | 0.021 | 0.730 | 0.36 | 2.99 | 1240 | 50 | OK | OK |
| EXAMPLE 30 | TZ-Black HIP | 0.132 | 0.521 | 0.024 | 0.677 | 0.25 | 2.72 | 1240 | 40 | OK | OK |
| EXAMPLE 31 | TZ-Black HIP | 0.219 | 0.52 | 0.01 | 0.749 | 0.42 | 3.16 | 1240 | 50 | OK | OK |
| EXAMPLE 32 | 3YS20A | 0.155 | 0.512 | 0.047 | 0.714 | 0.30 | 2.26 | 1430 | 20 | — | — |
| EXAMPLE 33 | 3YS20A | 0.154 | 0.511 | 0.043 | 0.708 | 0.30 | 2.27 | 1430 | 15 | — | — |
| EXAMPLE 34 | 3YS20A | 0.154 | 0.510 | 0.034 | 0.698 | 0.30 | 2.30 | 1430 | 25 | — | — |
| EXAMPLE 35 | 3YS20A | 0.154 | 0.506 | 0.025 | 0.665 | 0.26 | 2.24 | 1430 | 30 | — | — |

TABLE 2

| | THICKNESS | | | | | RATIO ZIRCONIA/FRP | APPARENT DENSITY g/cm³ | VICKERS HARDNESS Hv10 | STEEL BALL FRACTURE HEIGHT STEPS OF 5 CM (cm) |
|---|---|---|---|---|---|---|---|---|---|
| | ZIRCONIA mm | FRP mm | ABS RESIN mm | ADHESIVE LAYER mm | TOTAL mm | | | | |
| COMPARATIVE EXAMPLE 1 | 1.306 | 0.511 | — | 0.043 | 1.860 | 2.56 | 4.39 | 1430 | 10 |
| COMPARATIVE EXAMPLE 2 | 0.201 | 0.506 | — | — | 0.707 | 0.40 | 2.99 | 1430 | 5 |
| COMPARATIVE EXAMPLE 3 | 0.316 | — | 1.020 | 0.022 | 1.358 | — | 2.02 | 1430 | 5 |

TABLE 3

| | REFERENCE EXAMPLE | | | | | | | | |
|---|---|---|---|---|---|---|---|---|---|
| TYPE OF ZIRCONIA | SINTERING TEMPERATURE | DENSITY g/cm³ | RELATIVE DENSITY % | BENDING STRENGTH JISR1601 MPa | FRACTURE TOUGHNESS VALUE JISR1607 Mpam$^{0.5}$ | VICKERS HARDNESS JISR1610 Hv10 | ELASTIC MODULUS JISR1602 GPa | RELATIVE PERMITTIVITY ROOM TEMPERATURE, 1 GHz — | DIELECTRIC LOSS TANGENT ROOM TEMPERATURE, 1 GHz — |
| 3YS20A | 1500° C. - 2 h | 5.473 | 99.3 | 1300 | 4.7 | 1430 | 250 | 28.4 | 0.0003 |

TABLE 3-continued

REFERENCE EXAMPLE

| TYPE OF ZIR-CONIA | SIN-TERING TEMPER-ATURE | DENSITY g/cm³ | RELA-TIVE DENSITY % | BENDING STRENGTH JISR1601 MPa | FRACTURE TOUGHNESS VALUE JISR1607 Mpam$^{0.5}$ | VICKERS HARDNESS JISR1610 Hv10 | ELASTIC MODULUS JISR1602 GPa | RELATIVE PERMITTIVITY ROOM TEMPER-ATURE, 1 GHz | DIELECTRIC LOSS TANGENT ROOM TEMPER-ATURE, 1 GHz |
|---|---|---|---|---|---|---|---|---|---|
| 3YSE | 1450° C. - 2 h | 6.073 | 99.8 | 1400 | 4.7 | 1240 | 200 | 36.6 | 0.0022 |
| TZ-Black | 1400° C. - 1 h | 5.993 | 99.0 | 1199 | 5.1 | 1240 | 200 | 37.5 | 0.0053 |

TABLE 4

REFERENCE EXAMPLE

| | DENSITY g/cm³ | ELASTIC MODULUS Gpa | BENDING STRENGTH MPa | RELATIVE PERMITTIVITY ROOM TEMPERATURE, 1 MHz | DIELECTRIC LOSS TANGENT ROOM TEMPERATURE, 1 MHz |
|---|---|---|---|---|---|
| GLASS FIBER-REINFORCED PLASTIC | 2.0 | 10 | 400 | 5.0 | 0.010 |
| CARBON FIBER-REINFORCED PLASTIC | 1.5 | 80 | 1300 | — | — |

Example 41

700 g of TZ-3YS-E (manufactured by TOSOH Corporation) powder, 14 g of a commercial polycarboxylate macromolecular dispersant used as a dispersant, 3.5 g of commercial polyethylene glycol mono-para-iso-octylphenyl ether used as an antifoaming agent, 245 g of ethyl acetate and 245 g of n-butyl acetate used as solvents, 49 g of butyral resin (degree of polymerization: about 1,000) powder used as a binder, and 42 g of industrial dioctyl phthalate used as a plasticizer were added to a ball mill and mixed for 48 hours. Polyethylene terephthalate (PET) was used as a carrier film, and a green sheet was formed on the carrier film using a doctor blade device and a blade.

The obtained green sheet was placed on a porous alumina setter and sintered with an alumina setter used as a weight placed on the green sheet. During the sintering, temperature was increased from room temperature to 450° C. at a temperature rising speed of 5° C./h and held at 450° C. for 10 hours to perform degreasing. Then the temperature was increased from 450° C. to 1,000° C. at a temperature rising speed of 50° C./h and held at 1,000° C. for 5 hours. Then the temperature was held at 1,450° C. for two hours to perform sintering. The density of the obtained zirconia sintered body was 6.085 g/cm³, and its relative density was 99.9% or higher.

The obtained zirconia sintered body (thickness: about 0.5 mm) was cut into 32 mm×25 mm, and the cut piece was machined to a thickness of 0.321 mm using a surface grinding and a mirror polishing machine. To remove residual stress due to machining, the machining was performed on the upper and lower surfaces under the same conditions. The surface grinding was performed using a #140 grindstone. If the grinding speed is high, significant residual stress occurs, causing warpage. Therefore, the grinding was performed at low grinding speed. After the upper and lower surfaces were ground under the same conditions, mirror polishing was performed.

The mirror polishing was performed on the upper and lower surfaces under the same conditions using TegraForce (Marumoto Struers K. K.) with 9 μm, 6 μm, and 1 μm diamond grains. The polishing conditions for the 9 μm and 6 μm grains were a time of 10 minutes and a pressure of 3.5 N/cm², and the polishing conditions for the 1 μm grains were a time of 10 minutes and a pressure of 2.8 N/cm². The thickness of the obtained sintered body was 0.250 mm. The zirconia sintered body was flat with a maximum surface roughness of 1.381 μm per 1 cm².

The surface of the obtained zirconia sintered body thin plate and the surface of an epoxy resin-based glass fiber-reinforced plastic (epoxy/glass cloth laminate SL-EC, manufactured by Nitto Shinko Corporation) were washed with acetone. Then an epoxy-based thermosetting resin (product number "XN1245SR," manufactured by Nagase ChemteX Corporation) was uniformly applied to a surface to be bonded, and the zirconia sintered body thin plate and the glass fiber-reinforced plastic were bonded together under the condition of 120° C. for 30 minutes with a load uniformly applied to the upper and lower surfaces of the composite plate. The obtained composite plate was cut into pieces of 32 mm x 25 mm. No separation of the adhesive and no chipping of the zirconia due to machining were found, and the workability was high. To compute the apparent density, 2.0 g/cm³ was used as the density of the reinforced plastic.

The thickness of the produced composite plate was 0.900 mm. The thickness of the sintered body was 0.321 mm, the thickness of the adhesive layer was 49 μm, and the thickness of the fiber-reinforced plastic was 0.530 mm. The ratio of the thickness of the zirconia sintered body to the thickness of the fiber-reinforced plastic was 0.61. The apparent density of the composite plate was 3.35 g/cm³, and its Vickers hardness was 1,240. The maximum roughness of the surface of the obtained composite plate was 14.651 μm per 1 cm², and the obtained composite plate was a flat plate with small reflected image distortion and had high designability.

The steel ball drop test was performed in steps of 5 cm. The results were 40 cm, showing high impact resistance. Another steel ball drop test was performed. Specifically, the steel ball was dropped once from a height of 50 cm onto an undamaged portion of the tested test piece. No cracks occurred, and the impact resistance was higher than that evaluated in steps of 5 cm. The higher value may be because interfacial separation of the adhesive layer caused by the repeated impact test did not occur.

Figure 6:
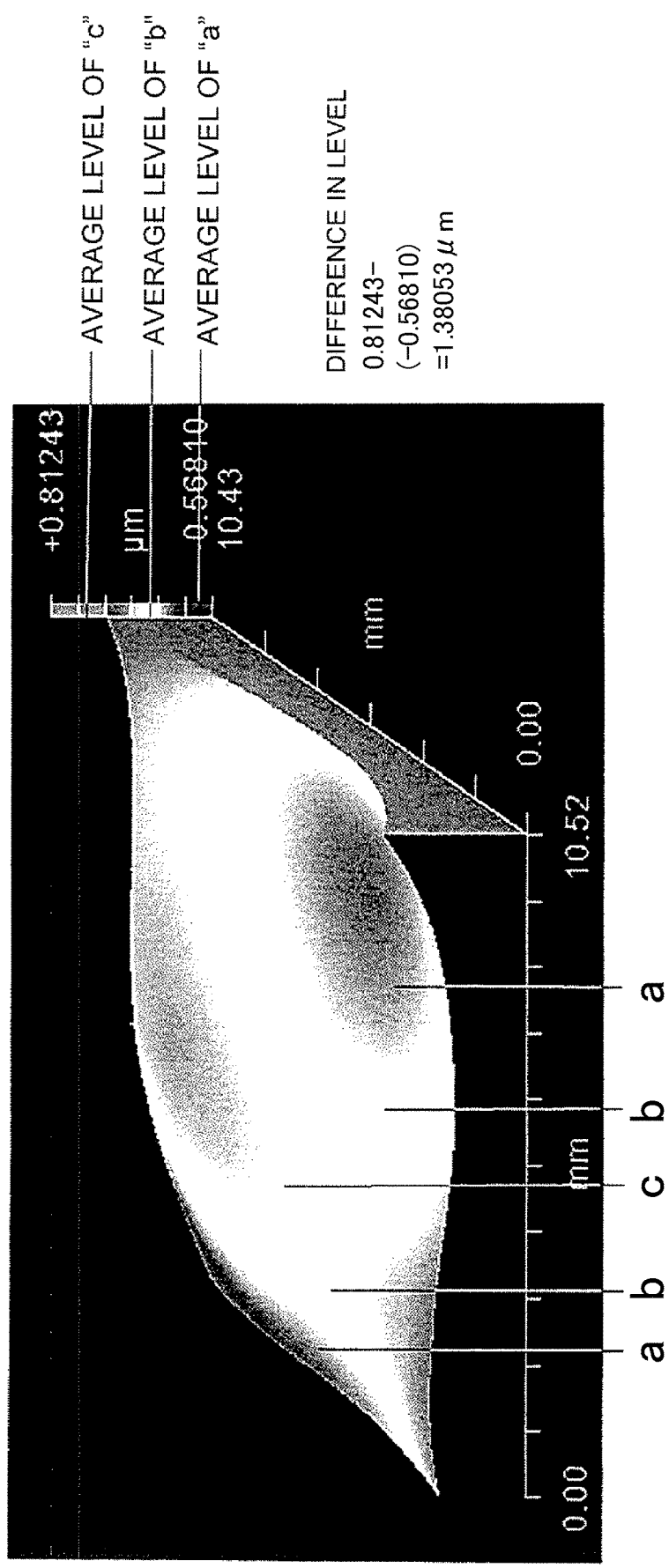
FIG. 6 shows a three-dimensional surface shape of a zirconia sintered body used in Example 41.

FIG. 6 shows the three-dimensional surface shape of the zirconia sintered body used in Example 41, and the surface shape after gradation processing is shown. The surface has a substantially flat planar shape within the area of 10.52 mm×10.43 mm. In the figure, a slope extending from the left rear corner toward the right front corner can be seen. The difference in level is 1.38053 μm calculated by subtracting −0.56810 μm from 0.81243 μm, and points a, b, and c each represent an average level.

Figure 7:
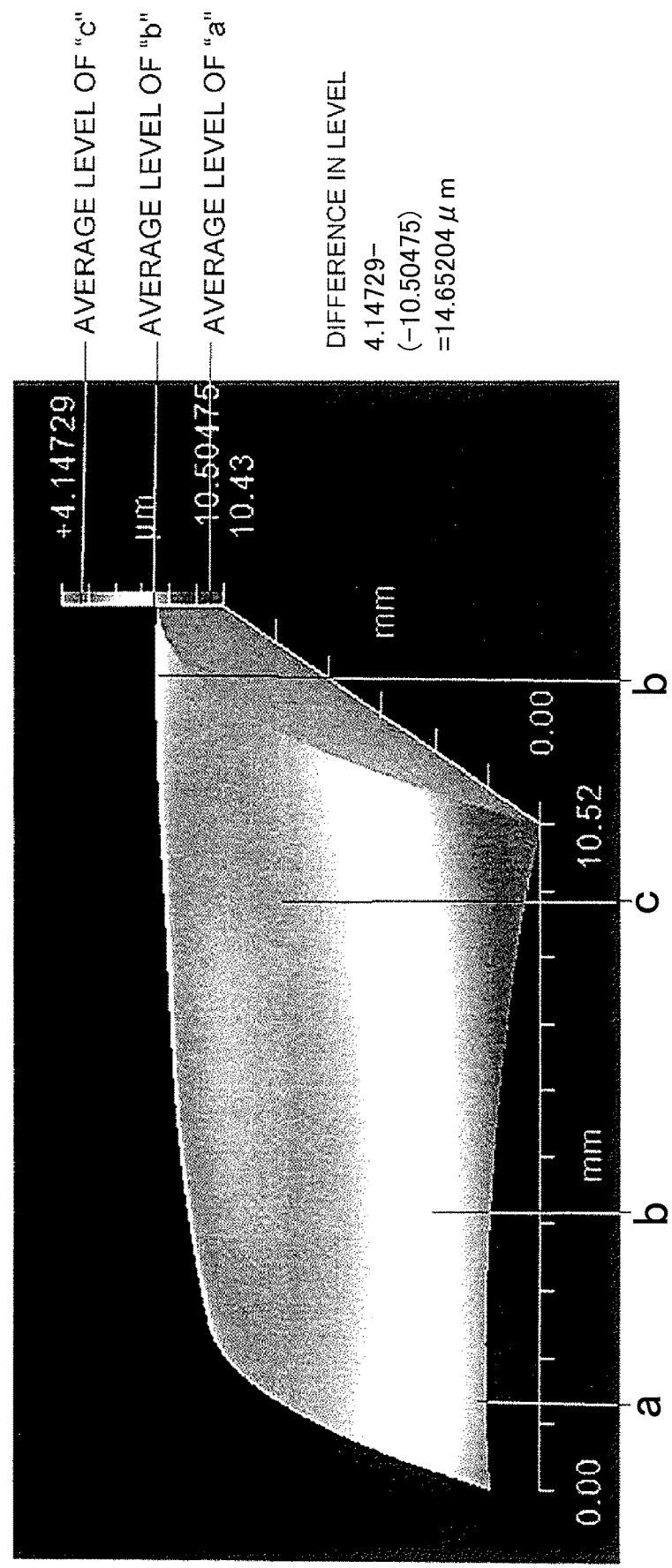
FIG. 7 shows a three-dimensional surface shape of a zirconia composite plate in Example 41.

FIG. 7 shows the three-dimensional surface shape of the zirconia composite plate in Example 41, and the surface shape after gradation processing similar to that in FIG. 6 is shown. Within the area of 10.52 mm×10.43 mm, a convex shape with a low front side, a low rear side, and a high central portion can be seen. The difference in level is 14.65204 μm calculated by subtracting −10.50475 μm from 4.14729 μm, and points a, b, and c each represent an average level.

Example 42

Figure 8:
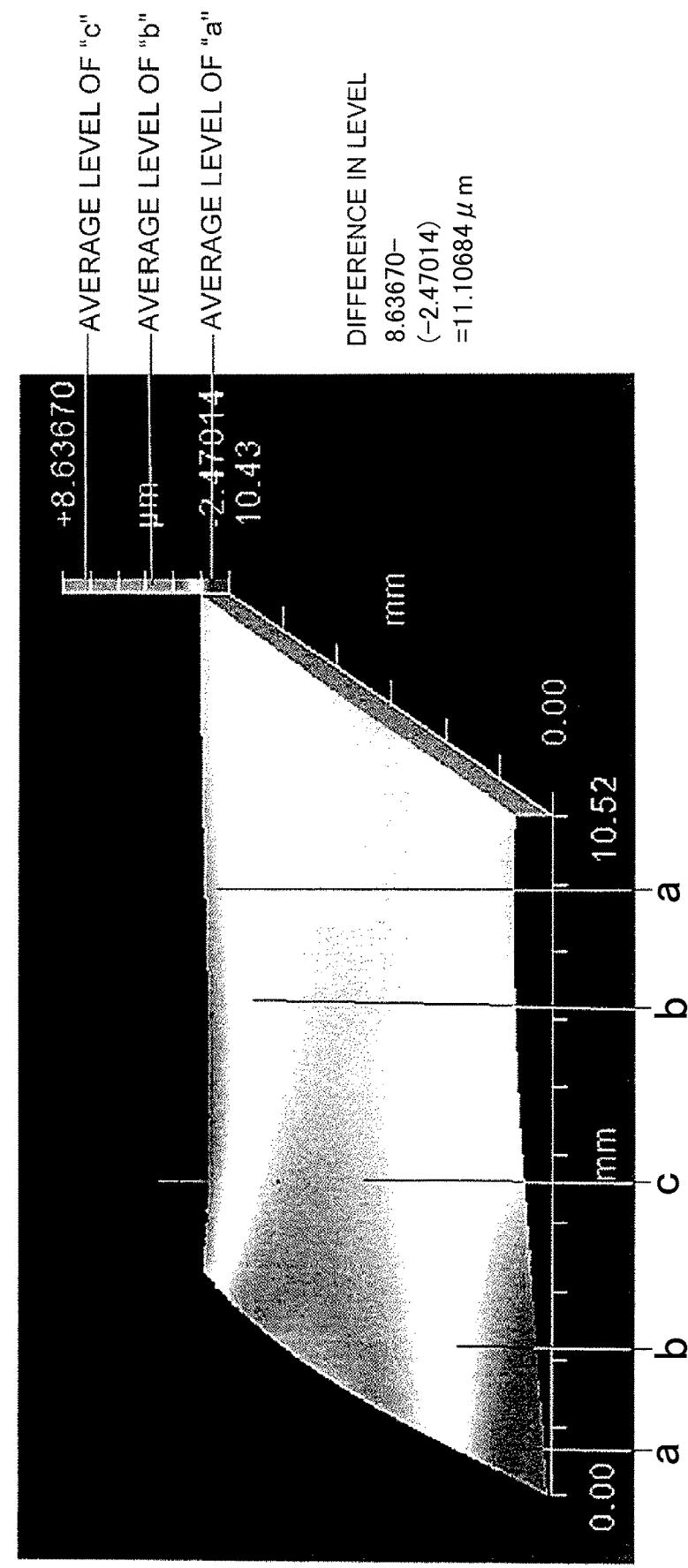
FIG. 8 shows a three-dimensional surface shape of a zirconia composite plate in Example 42.

FIG. 8 shows the three-dimensional surface shape of a zirconia composite plate in Example 42, and the surface shape after gradation processing similar to that in FIG. 6 is shown. Within the area of 10.52 mm×10.43 mm, a substantially flat shape in which the right side is slightly low and the central portion on the left side is high can be seen. The difference in level is 11.10684 μm calculated by subtracting −2.47014 μm from 8.63670 μm, and points a, b, and c each represent an average level.

A black zirconia powder (product name "TZ-Black," manufactured by TOSOH Corporation) was molded using a die press at a pressure of 50 MPa. The compact was further molded using a cold isostatic press (CIP) at a pressure of 200 MPa. The obtained compact was heated in air at a temperature rising speed of 100° C./h to a sintering temperature of 1,400° C. and held for 1 hour to sinter the compact. The opposite surfaces of the obtained zirconia sintered body were ground and polished to obtain a zirconia plate having a thickness of about 1 mm. The density of the obtained zirconia sintered body was 5.993 g/cm³, and its relative density was 99.0%. 6.053 g/cm³ was used as the true density of the black zirconia sintered body.

The surface of the obtained zirconia sintered body thin plate and the surface of a glass fiber-reinforced plastic (epoxy/glass cloth laminate SL-EC, manufactured by Nitto Shinko Corporation) were washed with acetone. Then an epoxy-based thermosetting resin (product number "XN1245SR," manufactured by Nagase ChemteX Corporation) was uniformly applied to a surface to be bonded, and the zirconia sintered body thin plate and the glass fiber-reinforced plastic were bonded together under the condition of 120° C. for 30 minutes with a load uniformly applied to the upper and lower surfaces of the composite plate. The thicknesses of the respective layers in the obtained composite plate are shown in TABLE 1. The obtained composite plate was cut into a piece of 32 mm×25 mm. The zirconia side of the cut composite plate was ground and polished to finally obtain a composite plate of about 0.8 mm. The grinding and polishing were performed under the conditions selected such that residual stress generated was as small as possible. No separation of the adhesive and no chipping of the zirconia due to machining were found, and the workability was high. To compute the apparent density, 2.0 g/cm³ was used as the density of the reinforced plastic.

The thickness of the produced composite plate was 0.817 mm. The thickness of the zirconia sintered body was 0.270 mm, the thickness of the adhesive layer was 37 μm, and the thickness of the fiber-reinforced plastic was 0.510 mm. The ratio of the thickness of the zirconia sintered body to the thickness of the fiber-reinforced plastic was 0.53. The apparent density of the composite plate was 3.23 g/cm³, and its Vickers hardness was 1,240. The maximum roughness depth of the surface of the obtained composite plate was 11.107 μm per 1 cm², and the obtained composite plate was a flat plate with small reflected image distortion and had high designability.

The steel ball drop test was performed in steps of 5 cm. The results were 40 cm, showing high impact resistance. Another steel ball drop test was performed. Specifically, the steel ball was dropped once from a height of 50 cm onto an undamaged portion of the tested test piece. No cracks occurred, and the impact resistance was higher than that evaluated in steps of 5 cm. The higher value may be because interfacial separation of the adhesive layer caused by the repeated impact test did not occur.

Reference Example 1

Figure 9:
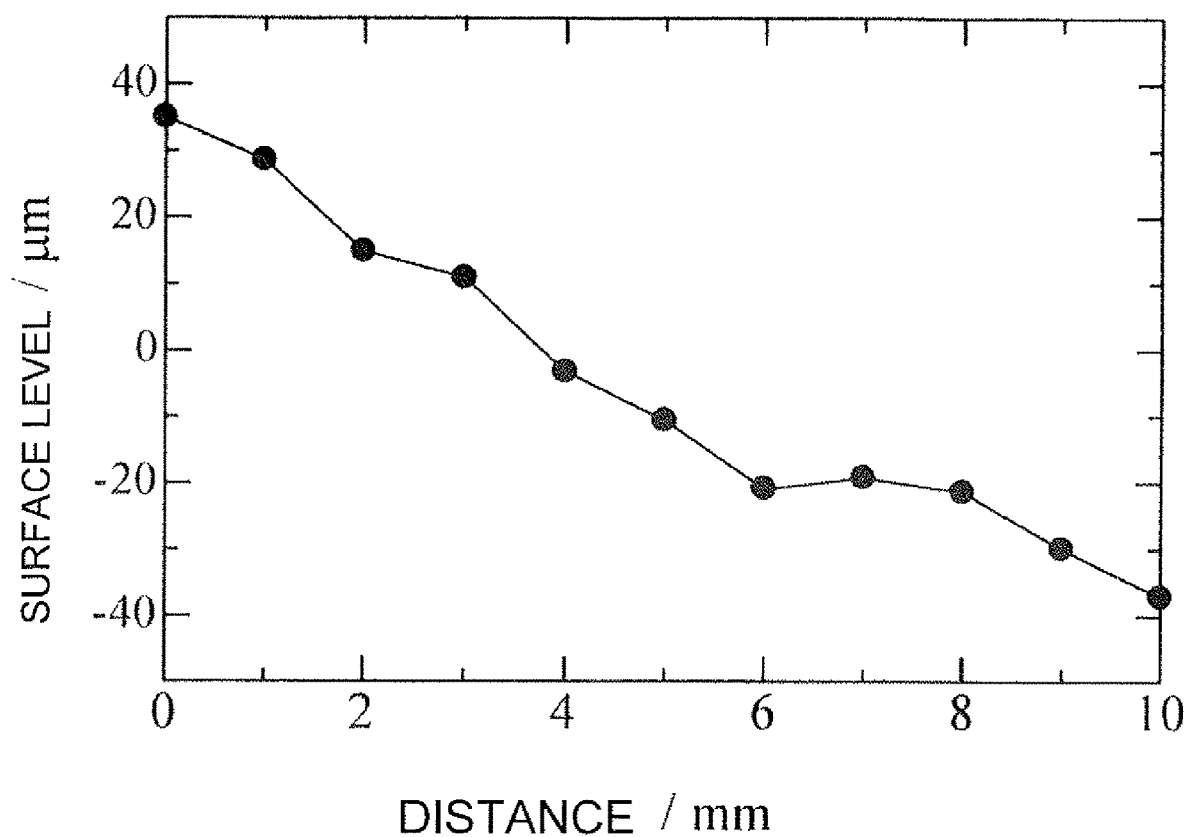
FIG. 9 shows a surface profile of a composite plate in Reference Example 1.

FIG. 9 shows a surface profile of a composite plate in Reference Example 1. The horizontal axis represents the distance from an edge of the composite plate, and the vertical axis represents the level of the surface. As can be seen from FIG. 9, as the distance from the edge increases, the level of the surface decreases, becomes lower than a reference point (0), and further decreases.

A zirconia composite plate with large surface roughness was produced using the same method as in Example 42. The zirconia composite plate was produced under such grinding and polishing conditions that residual stress remained in the machined product. The produced zirconia composite plate has low designability because an image reflected from the zirconia was distorted. The surface shape of the composite plate was measured under an optical microscope, and the maximum roughness depth of the surface per 1 cm² was found to be about 72 μm. FIG. 4 shows the two-dimensional data of the surface profile with the largest roughness depth.

Reference Example 2

Figure 10:
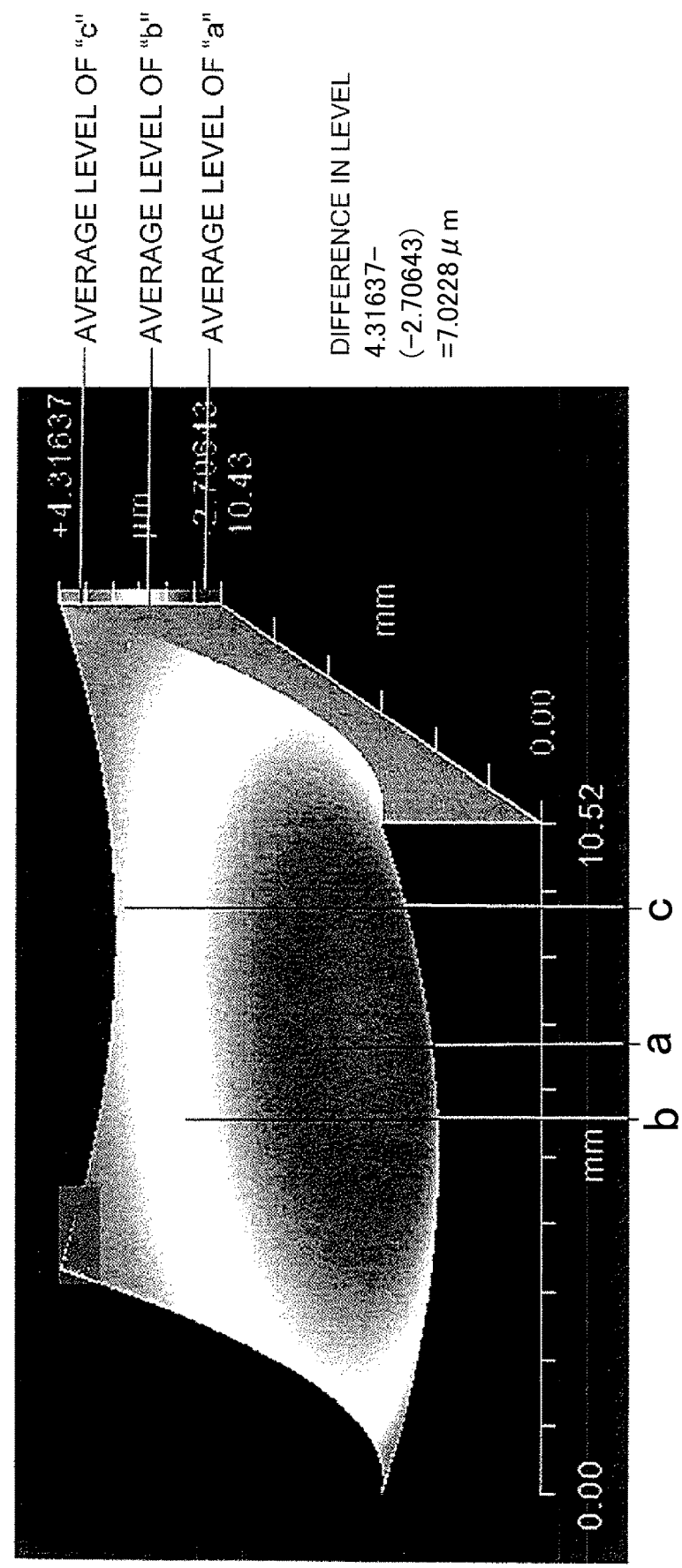
FIG. 10 shows the surface shape of a zirconia sintered body in Reference Example 2.

FIG. 10 shows the surface shape of a zirconia sintered body in Reference Example 2, and the surface shape after gradation processing similar to that in FIG. 6 is shown. Within the area of 10.52 mm×10.43 mm, a shape in which the central portion is lowest and the level increases toward the four corners can be seen. The difference in level is 7.0228 μm calculated by subtracting −2.70643 μm from 4.31637 μm, and points a, b, and c each represent an average level.

The surface roughness image shown is an image of a bulk zirconia sintered body (thickness: 1 mm) produced using the same procedure as in Example 42. The maximum roughness depth of the surface per 1 cm² was 7.0228 μm. An image reflected from the surface of the sintered body was not distorted, and high designability was obtained.

Example 43

A white zirconia powder (product name "3YS20A," manufactured by TOSOH Corporation) was molded at a pressure of 50 MPa using a die press. The obtained compact was further molded using a cold isostatic press (CIP) at a pressure of 200 MPa.

The obtained compact was heated in air at a temperature rising speed of 100° C./h to 1,500° C. and held at 1,500° C. for 2 hours to sinter the compact. The opposite sides of the obtained zirconia sintered body were grounded and polished to obtain a zirconia thin plate having a prescribed thickness.

The surface of the obtained zirconia thin plate and the surface of an epoxy resin-based glass fiber-reinforced plastic (epoxy/glass cloth laminate SL-EC, manufactured by Nitto Shinko Corporation) were washed with acetone. Then an epoxy-based thermosetting resin (product number "AW136H," manufactured by Nagase ChemteX Corporation) was uniformly applied to a surface to be bonded, and the zirconia thin plate and the glass fiber-reinforced plastic were bonded together under the condition of 100° C. for 10 minutes with a load uniformly applied to the upper and lower surfaces of the composite plate. The thicknesses of the respective layers of the obtained composite plate are shown in TABLE 5.

The results of evaluation of the obtained composite plate are shown in TABLE 5. The steel ball drop test was performed in steps of 5 cm, and the results showed that the impact resistance was high, i.e., 15 cm.

glass fiber-reinforced plastic were bonded together using a black epoxy-based thermosetting resin (product number "XN1245SR," manufactured by Nagase ChemteX Corporation) under the condition of 120° C. for 30 minutes with a load uniformly applied to the upper and lower surfaces of the composite plate. The ceramic surface of the obtained composite plate was ground and mirror-polished such that the total thickness of the zirconia, the adhesive, and the fiber-reinforced plastic was 0.8 mm.

The steel ball drop test was performed in steps of 5 cm using the same method as in Example 43. The results showed that the impact resistance was high, i.e., 25 cm.

The lightness index L* and chromaticness indexes a* and b* in the color (L*, a*, b*) of the surface were measured using the same method as in Example 43. The lightness index was lower than that in Example 43, and the color of the black adhesive was visible, so that the white color deteriorated.

Comparative Example 8

A white zirconia sintered body (3YS20A) was obtained in the same method as in Example 43. Grinding and polishing were performed to obtain a flat 1 mm zirconia sintered body.

The steel ball drop test was performed in steps of 5 cm using the same method as in Example 43. The results showed that the impact resistance was low, i.e., 5 cm.

The lightness index L* and chromaticness indexes a* and b* in the CIE1976 L*a*b* color space were measured using the same method as in Example 43. In Example 43, the white color was higher than that in Reference Example 3. It was found that the color in Example 43 was close to the color of bulk zirconia (only a zirconia sintered body having a thickness of 1 mm or more, not a composite plate).

TABLE 5

| | | THICKNESS [mm] | | | | APPARENT DENSITY g/cm³ | LIGHTNESS INDEX L* | CHROMATICNESS INDEX | | TOTAL LIGHT TRANSMITTANCE [%] | STEEL BALL FRACTURE HEIGHT STEPS OF 5 CM |
|---|---|---|---|---|---|---|---|---|---|---|---|
| | ADHESIVE | ZIRCONIA | FRP | ADHESIVE LAYER | TOTAL | | | a* | b* | | |
| EXAMPLE 43 | AW136H | 0.219 | 0.522 | 0.004 | 0.745 | 3.01 | 86.12 | −0.51 | −0.6 | 4.1 | 15 cm |
| REFERENCE EXAMPLE 3 | XN1245SR | 0.208 | 0.528 | 0.014 | 0.750 | 2.93 | 82.37 | −0.31 | −0.58 | 11.3 | 25 cm |
| COMPARATIVE EXAMPLE 8 | BULK ZIRCONIA | 1.0 | — | — | 1.0 | 5.47 | 94.40 | −0.37 | −0.98 | 1.4 | 5 cm |

A color difference meter was used to measure the lightness index L* and chromaticness indexes a* and b* in the color (L*, a*, b*) of the surface. The lightness index L* was higher than that in Reference Example 3, and the obtained composite plate had a better white color.

The total light transmittance was measured using a haze meter. The total light transmittance was lower than that in Reference Example 1. This showed that transmission of light was prevented and the white color was improved.

Reference Example 3

Figure 11:
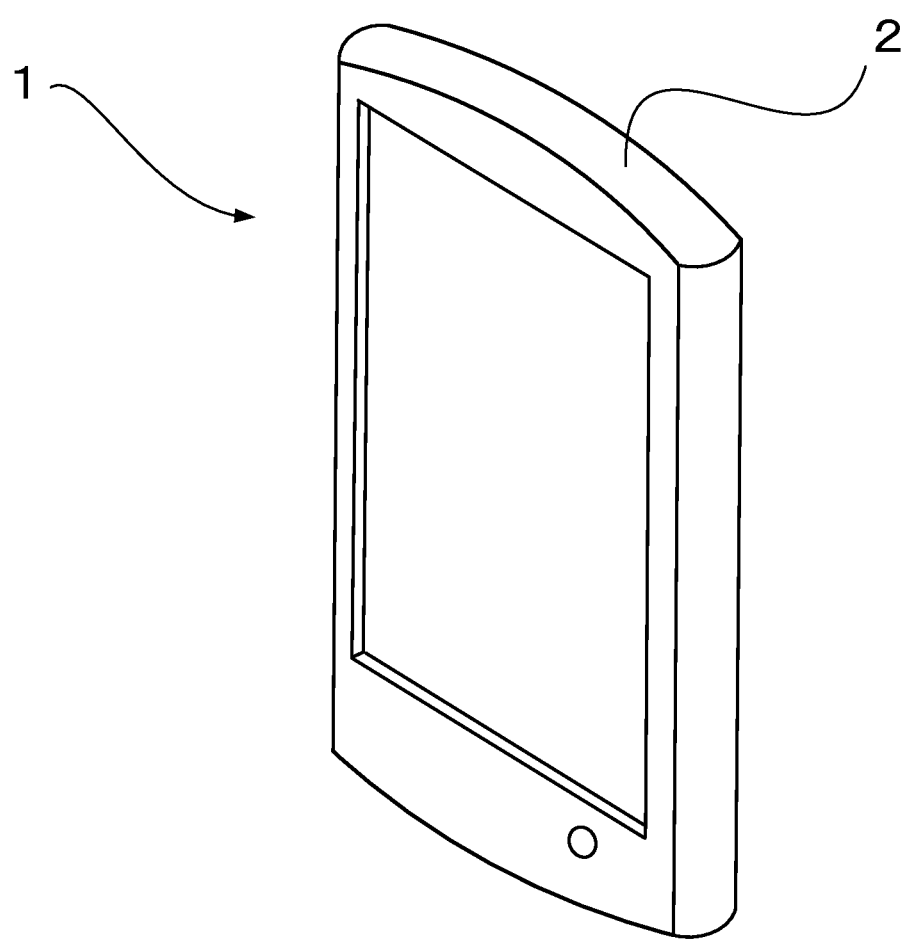
FIG. 11 is a diagram illustrating a tablet terminal device in a first embodiment.

A white zirconia sintered body (3YS20A) was obtained using the same method as in Example 43. No separation of the adhesive and no chipping of the zirconia due to machining were found, and the workability was high. Then the mirror-polished surface of the zirconia sintered body and the First Embodiment FIG. 11 is a diagram showing a tablet terminal device in a first embodiment.

In this embodiment, a case 2, which is an exterior component of the tablet terminal device 1 serving as a mobile electronic device, is formed from a composite plate in any of the above Examples. The mobile electronic device is not limited to the tablet terminal device and may be any of mobile phones, smartphones, etc.

Second Embodiment

Figure 12:
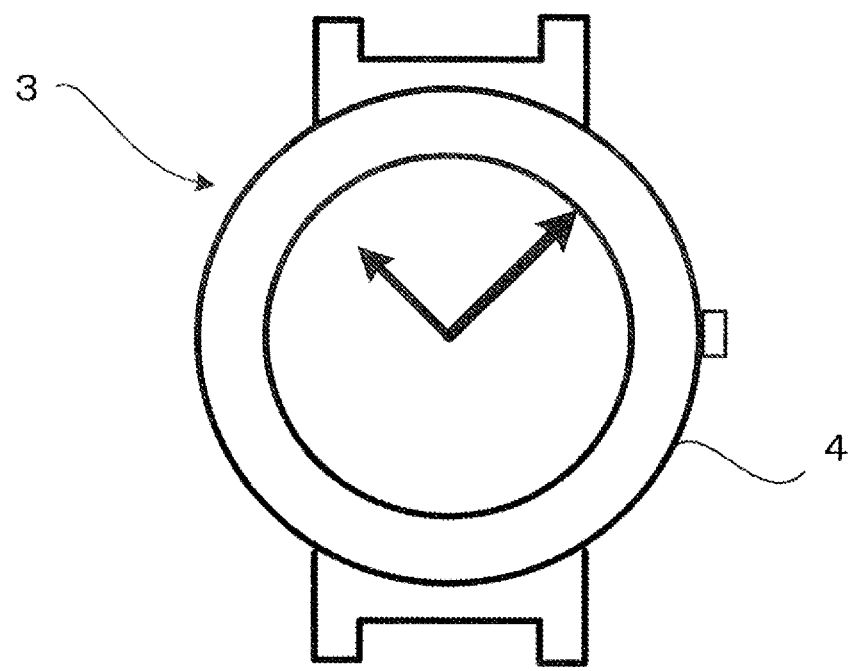
FIG. 12 is a diagram illustrating a wristwatch in a second embodiment.

FIG. 12 is a diagram showing a wristwatch in a second embodiment.

In this embodiment, a watch case 4 which is a watch component (exterior component) of the wristwatch 3 serving as the watch is formed from a composite plate in any of the above Examples. The watch is not limited to the wristwatch and may be any of pocket watches, stopwatches, etc.

INDUSTRIAL APPLICABILITY

The composite plate including a zirconia sintered body and a fiber-reinforced plastic according to the present invention is lightweight and has impact resistance and scratch resistance. Therefore, the composite plate can preferably be used for small and thin components of mobile electronic devices and watch components.

REFERENCE SIGNS LIST

1 tablet terminal device
2 case
3 wristwatch
4 watch component (watch case)

The invention claimed is:

1. A composite plate comprising a laminate including a zirconia sintered body and a fiber-reinforced plastic that are closely fixed to each other by an adhesive, the composite plate having a thickness of 0.624 to 0.966 mm, wherein a ratio of a thickness of the zirconia sintered body to a thickness of the fiber-reinforced plastic is 0.16 to 0.57, the composite plate has an apparent density of 4.3 g/cm$^3$ or less, and the fiber-reinforced plastic is selected from the group consisting of glass fiber-reinforced plastic and; carbon fiber-reinforced plastic.

2. The composite plate according to claim 1, comprising the laminate including the zirconia sintered body and the fiber-reinforced plastic that are closely fixed to each other with a white adhesive, herein the zirconia sintered body shows a white color with a surface color (L*, a*, b*) in a range where L* is 86 to 94, a* is −1 to +1, and b* is −1 to +1.

3. The composite plate according to claim 1, wherein the zirconia sintered body is zirconia containing 2 to 10 mol % yttria with respect to the zirconia.

4. The composite plate according to claim 1, wherein the zirconia sintered body is zirconia containing at least one type selected from the group consisting of a white pigment, a transition metal oxide, and a color pigment.

5. The composite plate according to claim 1, wherein the zirconia sintered body has a relative density of 97% or more.

6. The composite plate according to claim 1, wherein the zirconia sintered body has a Vickers hardness of 1,000 or more.

7. The composite plate according to claim 1, wherein the composite plate has high impact resistance with a fracture height of 10 cm or more in a test in which a steel ball of 130 g is freely dropped thereon.

8. The composite plate according to claim 1, wherein the composite plate has an apparent density of 0.9 to 4.3 g/cm$^3$.

9. A composite plate comprising a laminate including a zirconia sintered body and a fiber-reinforced plastic that are closely fixed to each other by an adhesive, the composite plate having a thickness of 0.624 to 0.966 mm, wherein a maximum roughness depth of a surface of the zirconia sintered body is 50 μm or less per 1 cm', a ratio of a thickness of the zirconia sintered body to a thickness of the fiber-reinforced plastic is 0.16 to 0.57, the composite plate has an apparent density of 4.3 g/cm$^3$ or less, and the fiber-reinforced plastic is selected from the group consisting of glass fiber-reinforced plastic and; carbon fiber-reinforced plastic.

10. The composite plate according to claim 9, comprising the laminate including the zirconia sintered body and the fiber-reinforced plastic that are closely fixed to each other with a white adhesive, wherein the zirconia sintered body shows a white color with a surface color (L*, a*, b*) in a range where L* is 86 to 94, a* is −1 to +1, and b* is −1 to +1.

11. A case for a mobile electronic device using the composite plate according to claim 1.

12. A watch component using the composite plate according to claim 1.

13. A method for producing the composite plate according to claim 1, comprising
bonding the zirconia sintered body and the fiber-reinforced plastic using an epoxy-based thermosetting adhesive at a temperature of 300° C. or lower.

14. The method for producing the composite plate according to claim 13, wherein the zirconia sintered body is obtained by forming a slurry into a green sheet having a thickness of 1 mm or less, the slurry being prepared by mixing zirconia powder and an organic binder, and sintering the green sheet and the slurry at 1,300 to 1,500° C.

15. A method for producing the composite plate according to claim 9, comprising
bonding the zirconia sintered body and the fiber-reinforced plastic using an epoxy-based thermosetting adhesive at a temperature of 300° C. or lower.

* * * * *